United States Patent [19]
Hoshizaki et al.

[11] Patent Number: 5,121,010
[45] Date of Patent: Jun. 9, 1992

[54] PHASE DETECTOR WITH DEADZONE WINDOW

[75] Inventors: Gary W. Hoshizaki, Mesa; Paul E. Fletcher, Phoenix; Laurin Ashby, Mesa, all of Ariz.

[73] Assignee: Motorola, Inc., Schaumburg, Ill.

[21] Appl. No.: 655,483

[22] Filed: Feb. 14, 1991

[51] Int. Cl.[5] .............................................. H03L 7/00
[52] U.S. Cl. ..................... 307/528; 328/134; 331/1 A; 331/25
[58] Field of Search ............... 307/510, 528, 525, 526, 307/527; 331/1 A, 25; 328/133, 134, 155

[56] References Cited

U.S. PATENT DOCUMENTS 4,801,894 1/1989 Garner ............................ 307/528 X Primary Examiner—Robert J. Pascal
Attorney, Agent, or Firm—Robert D. Atkins

[57] ABSTRACT

A phase lock loop for use in gate array applications with fixed transistors geometries maintains a predetermined phase delay between an input signal and an output signal. The phase comparison cycle operates over multiple periods of the input signal for increasing the operating frequency and simplifying timing considerations throughout the phase lock loop. A phase detector circuit detects a predetermined phase difference between the input signal and the output signal and provides a control signal and a clock signal at different transitions of the input signal. An up/down counter provides a count value migrating within a range of values in response to the control signal at the occurrence of the clock signal. The counter value selects a tap point of a delay line having single inverter resolution for delaying the input signal and maintaining the predetermined phase relationship between the input signal and the output signal of the phase lock loop. The updates to the delay line achieve steady state by waiting one or more periods of the input signal before the next phase comparison cycle preventing over-correction. The phase correction portion of the cycle is inhibited when the input signal and output signal are less than the predetermined phase difference thereby avoiding possible unnecessary corrections to the phase lock loop. The phase lock loop may be functionally divided among multiple macros in a gate array library and conveniently disposed in the gate array.

26 Claims, 9 Drawing Sheets

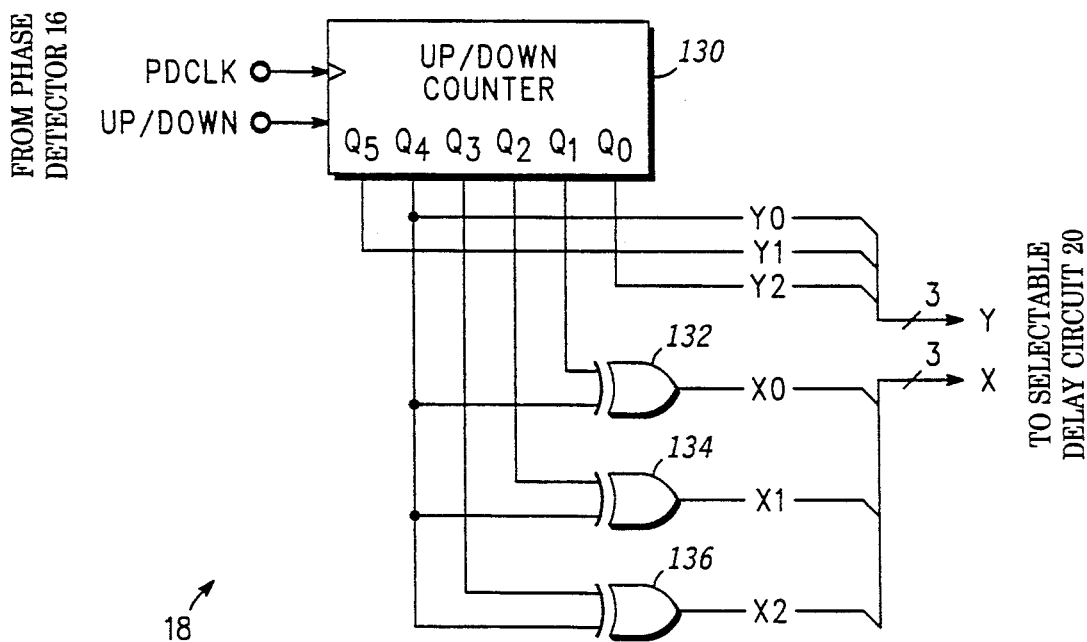
FIG. 6
FIG. 10
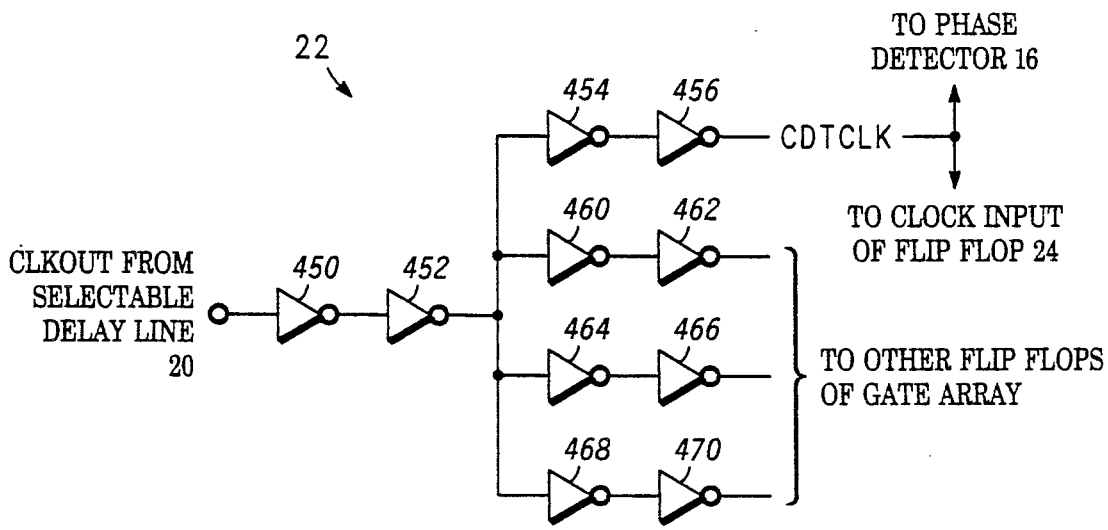

PHASE DETECTOR WITH DEADZONE WINDOW

CROSS REFERENCE TO RELATED PATENT APPLICATION

This application is related to copending U.S. Pat. application 07/655,489, "DIGITAL PHASE LOCK LOOP FOR A GATE ARRAY", filed Feb., 14, 1991, by Laurin Ashby et al with at least one common inventor and assigned to the same assignee, Motorola, Inc. This application is further related to copending U.S. Pat. application 07/655,490, "DIGITAL DELAY LINE WITH INVERTER TAP RESOLUTION", filed Feb., 14, 1991, by Laurin Ashby et al with at least one common inventor and assigned to the same assignee, Motorola, Inc. This application is further related to copending U.S. Pat. application 07/655,484, "OPPOSITE PHASE CLOCK GENERATOR CIRCUIT", filed Feb., 14, 1991, by Gary Hoshizaki and assigned to the same assignee, Motorola, Inc.

FIELD OF THE INVENTION

This invention relates in general to a phase detector responsive to first and second input signals for providing a control signal and a clock signal at different transitions of the input signal, wherein the clock signal is disabled when the phase difference between the first and second inputs signal is less than the resolution of the phase detector.

BACKGROUND OF THE INVENTION

Virtually every circuit design in modern electronic systems involves some type of data transfer between integrated circuit (IC) chips, possibly located on separate printed circuit boards. For digital systems, the data is typically transferred at the transitions of a clock signal from a register or flipflop on a sending IC to a similar device on a receiving IC. For error free transmissions, the clock signals appearing at each register should operate in-phase with each other and have equal edge transition rates. Such clock signals may originate from a common source which is buffered through one or more clock trees for distributing like clock signals to the flipflops and registers disposed throughout the ICs. The clock distribution tree may comprise a plurality of buffers wherein the output of one buffer drives the input of several others such that the clock signal is distributed evenly throughout. With a clock distribution tree each buffer drives a maximum of ten to twelve other buffers, flipflops or registers thereby avoiding the stress and poor performance of overloading the source circuit. In addition, each signal path through the clock distribution tree is made the same length in terms of propagation delay for providing the plurality of output clock signals operating in-phase with equal edge transition rates. The sending and receiving ICs each typically house a dedicated internal clock distribution tree for supplying the clock signals for its respective flipflops. Therefore, the output clock signals of the clock distribution tree of the sending IC should also operate in-phase with, and should have substantially equal edge transition rates, as the output signals of the clock distribution tree of the receiving IC. Unfortunately, there is often timing skew between the output clock signals of the clock distribution trees of the sending and receiving ICs.

In order to latch the incoming data, it is important to maintain the correct timing relationship between the arrival of the data signal at the D-input of the receiving flipflop and the transition of the clock signal through the clock distribution tree. If the clock transition occurs before the data becomes valid a setup time problem exits. Alternately, a hold time problem occurs if the data is no longer valid when the clock signal arrives. Such timing considerations are especially important for systems operating at a high data rate, say 50 megahertz and above. One of the principal causes of the noted setup and hold time problems is the timing skew between the clock signals from a first clock distribution tree on the sending IC and the clock signals from a second clock distribution tree on the receiving IC. Depending upon the number of buffer layers within the first and second clock distribution trees and associated insertion delay, it is possible to insert appreciable skew between the output clock signals thereof. For example, the first clock distribution tree in the sending IC may have only two or three buffer layers for driving a small number of registers while the second clock distribution tree in the receiving IC may include four or five buffer layers for driving many more flipflops and registers. The delay through the second clock distribution tree is therefore longer than that through the first clock distribution tree producing the aforedescribed timing skew and possibly causing data transmission errors from the phase difference between the output clock signals of the clock distribution trees of the sending and receiving ICs.

One known solution to the problem of timing skew between the clock distribution trees of sending and receiving ICs is the use of a phase lock loop to compensate for the differences in respective delays. In general, a primary clock signal is applied through a selectable delay line to the input of the first clock distribution tree of the sending IC. The primary clock signal is also applied at the first input of a phase detector while the second input of the phase detector is coupled to one output of the clock distribution tree. The output of the phase detector controls the selectable delay line such that a known phase relationship is established between the primary clock signal and the output clock signals of the clock distribution tree. A similar phase lock loop is provided for the clock distribution tree of the receiving IC for establishing a similar phase relationship between the primary clock signal and its output clock signals thereby maintaining the clock signals in the sending and receiving ICs substantially in-phase.

The phase comparison and correction of most if not all such phase lock loops is completed in one period of the primary clock signal, hence, the timing of the signal propagations becomes very important. Indeed, the maximum operating frequency of the phase lock loop is restricted by the time required to perform the phase comparison and correction in one period of the primary clock signal. Consequently, the phase lock loop as described above is typically implemented in known environments wherein the transistor sizes are variable and may be selected according to predetermined design parameters. For such dedicated uses, the size of the clock tree and the length of the delay lines are also known ahead of time simplifying the design. Furthermore, the components of the conventional phase lock loop are often grouped together and centrally disposed on the IC for minimizing propagation delay and timing skew although at the expense of consuming large portions of prime area on the IC.

In the world of gate arrays as used on ASIC (Application Specific Integrated Circuit) type integrated circuits, the designer must deal with fixed transistor geometries of say 48/4 microns width and length as part of standard core cells. The advantage of gate arrays in simplifying the design process is well known in the art. Yet, the fixed transistor sizes associated therewith make the implementation of the phase lock loop much more difficult in that the designer may no longer manipulate delay and drive parameters by adjusting individual transistor geometries. Indeed, most if not all known gate array libraries fail to provide a phase lock loop macro with fixed geometry transistors for maintaining synchronized clock signals throughout the system.

A phase detector is one of the components of the phase lock loop. Again conventional phase detectors often rely upon customization of the transistor geometries to achieve the desired drive levels and propagations delays therethrough. Such transistor personalizing is impractical in a gate array since the phase detector is constructed with standard transistor cells having fixed geometries. Furthermore, many phase detectors compare the phase differential of the input signals and issue one or more control signals for performing the phase correction during one period of the primary clock signal. The time required to update the selectable delay line in response to the control signals in preparation of the next phase comparison all during one period of the primary clock signal limits the maximum operating frequency. Another problem for conventional phase detectors is their tendency toward providing phase correction regardless of the input phase differential.

A selectable delay line is another component of the aforedescribed phase lock loop. The conventional delay line may comprise a string of serially coupled inverters with tap points at every other inverter for providing an output signal operating in-phase with the primary clock signal yet delayed by a selectable amount. The resolution is thus two inverter delays. Since the minimum phase differential achievable with the phase lock loop is directly related to the resolution of the delay line, a higher resolution (lower incremental delays) allows the output signals of the clock distribution tree to be positioned closer to the phase of the primary clock signal. This increases the resolution of the phase lock loop and reduces the phase error between the output clock signals of the clock distribution trees on the sending and receiving ICs. In the previous data transfer example, a smaller nominal phase difference between the output signals of clock distribution trees of the sending and receiving ICs reduces the chance of data transmission errors and allows higher data rates. Thus, it is desirable to provide smaller incremental delays through the selectable delay line than the conventional two-inverter steps.

In many circuit designs such as the selectable delay line of the phase lock loop, it is desirable to generate opposite phase clock signals operating at the same frequency with substantially 180 degrees phase difference. The common approach is to split an input clock between first and second conduction paths; one having an even number of inverters and the other having an odd number of inverters. The transistors through the first and second conduction paths are custom sized for providing equal propagation delays through the first and second conduction paths. Yet in gate arrays, the luxury of personalizing transistor geometries is impractical because the available standard gate array cells have fixed transistor sizes. Another approach is needed for generating the opposite phase clock signals with equal edge transition rates from fixed geometry transistors.

Hence, what is needed is an improved phase detector implemented in a gate array with standard geometry transistors and responsive to first and second input signals for providing a control signal and a clock signal at different transitions of the input signal, wherein the clock signal is disabled when the phase difference between the first and second inputs signal is less than the resolution of the phase detector.

SUMMARY OF THE INVENTION

Briefly stated, the invention comprises a phase detector circuit having first and second inputs respectively coupled for receiving first and second inputs signals and having first and second outputs for providing first and second output pulses. A first circuit includes a first input coupled for receiving the first input signal and a second input coupled for receiving the second input signal which is delayed through a predetermined propagation delay for detecting a predetermined phase difference between the first input signal and the second input signal and providing the first output pulse having at least a minimum duration when the first input signal leads the second input signal by the predetermined phase difference. The first output pulse also has at least the minimum duration when the first input signal and the second input signal are within the predetermined phase difference. The first output pulse has less than the minimum duration when the first input signal lags the second input signal by the predetermined phase difference. A second circuit includes a first input coupled for receiving the second input signal and a second input coupled for receiving the first input signal which is delayed through the predetermined propagation delay for detecting the predetermined phase difference between the second input signal and the first input signal and providing the second output pulse having at least the minimum duration when the second input signal leads the first input signal by the predetermined phase difference. The second output pulse also provides at least the minimum duration when the second input signal and the first input signal are within the predetermined phase difference. The second output pulse has less than the minimum duration when the second input signal lags the first input signal by the predetermined phase difference.

One advantage of the present invention is the feature of enabling an output clock signal when the first or second output pulse of the phase detector has at least a minimum duration while disabling the output clock signal when the input phase differential is less than its resolution as indicated by both output pulses have at least the minimum duration thereby avoiding unnecessary corrections. A control signal also derived from the first and second output pulses provides a first state when the first input signal leads the second input signal by a predetermined phase difference and a second state when the second input signal leads the first input signal by the predetermined phase difference. Furthermore, the first and second circuits feature symmetrical conduction paths allowing the phase detector to be implemented in a gate array with standard geometry transistors.

BRIEF DESCRIPTION OF THE DRAWING

FIG. 6 is a schematic diagram illustrating the preferred embodiment of the counter;

FIG. 10 is a schematic diagram illustrating the preferred embodiment of the clock distribution tree.

DETAILED DESCRIPTION OF THE PREFERRED EMBODIMENT

Figure 1:
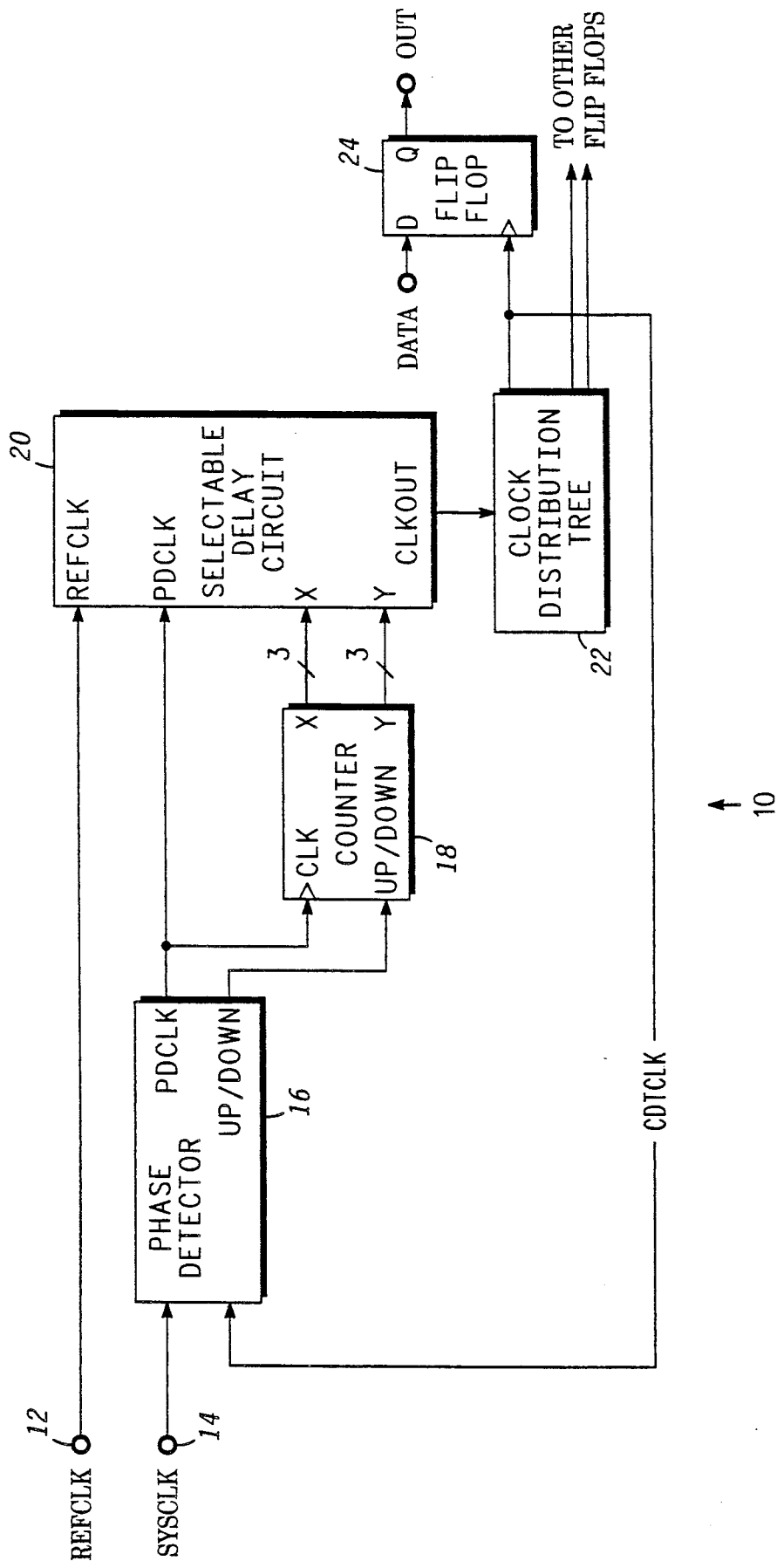
FIG. 1 is a simplified block diagram illustrating a phase lock loop.

A simplified block diagram of the present invention is shown in FIG. 1 as phase lock loop 10 suitable for manufacturing with ASIC gate array macros using conventional integrated circuit processing techniques. A gate array macro is a predefined transistor arrangement for providing a known function, such as a phase detector or a counter, and is usually stored in the library of a computer aided design system. The gate array macro may be called from the library and disposed on the gate array as a functional block such that the designer need only be concerned with making the external connections thereto. A key feature is the division of phase lock loop 10 into a plurality of gate array macros operating as separate and distinct functional blocks, each block comprising fixed geometry transistors. The phase comparison and correction occurs over several periods of the system clock making the gate array macros robust to propagation delay and timing skew therebetween.

Referring to FIG. 1, a primary reference clock signal REFCLK is applied at input 12 while clock signal SYSCLK is applied through input 14 to the first input of phase detector 16. The output of phase detector 16 provides a phase detector clock PDCLK and an UP/DOWN control signal to counter 18. The PDCLK signal clocks the next value of counter 18 while the UP/DOWN signal controls the count direction, either increasing or decreasing count value depending upon its logic state. Counter 18 provides a 3-bit X-coordinate signal and a 3-bit Y-coordinate signal to delay circuit 20 for selecting the delay of the REFCLK clock signal also applied thereto. Delay circuit 20 also receives the PDCLK clock signal from phase detector 16. The CLKOUT output signal of delay circuit 20 is distributed through clock distribution tree 22 for providing a plurality of clock signals feeding the clock inputs of flipflop circuits like 24 throughout the gate array. The clock distribution tree may comprise a plurality of buffers wherein the output of one buffer drives the input of several other buffers such that the clock signal is distributed evenly throughout. It is assumed that clock distribution tree 22 has substantially equal propagation delay through each distribution path such that the output signals thereof operate in-phase with substantially equal edge transition rates. Therefore, any one of the output clock signals may feed back to the second input of phase detector 16 for providing the phase comparison against the SYSCLK clock signal appearing at its first input. There is a predetermined timing relationship between the REFCLK and SYSCLK clock signals wherein SYSCLK lags REFCLK by at least the maximum worst case propagation through clock distribution tree 22 and delay circuit 20 at its minimum setting over the anticipated operating conditions.

The actual implementation of the ASIC gate array typically includes hundreds or even thousands of flipflop circuits like 24, each of which receives a clock signal from one of the plurality of outputs of clock distribution tree 22. Phase lock loop 10 maintains a predetermined phase relationship between the REFCLK signal and the output clock signals of clock distribution tree 22. A second ASIC (not shown) in communication with the first ASIC uses another clock distribution tree like 22 and another phase lock loop like 10 for providing a similar phase relationship between the REFCLK signal and the output clock signals of clock distribution tree like 22 on the second ASIC. Thus, the output clock signals of clock distribution trees like 22 on the first and second ASIC chips operate substantially in-phase with equal edge transition rates.

The general operation of phase lock loop 10 proceeds as follows. Phase detector 16 compares the phase of the SYSCLK clock signal with one output signal from clock distribution tree 22 and generates the UP/DOWN signal and the PDCLK signal accordingly although during separate periods of SYSCLK. For example, the UP/DOWN signal may be set to a logic one if the SYSCLK clock signal leads the output signal of clock distribution tree 22. Alternately, the UP/DOWN signal may be logic zero if the SYSCLK clock signal lags the output signal of clock distribution tree 22. In one embodiment, it takes four periods of the SYSCLK clock signal to complete a phase comparison cycle. Thus, one important feature pipelines the various discrete operations within phase lock loop 10, such as the separation of the UP/DOWN signal and the PDCLK clock signal by one period of the SYSCLK clock, whereby the functional blocks of phase lock loop 10 may be divided into different gate array macro cells and even located in different physical areas of the ASIC integrated circuit without major concern for timing problems, propagation delay and general race conditions. One gate array macro may comprise phase detector 16, while another gate array macro includes counter 18 and yet another gate array macro includes delay circuit 20.

Counter 18 is responsive to the PDCLK clock signal for incrementing and decrementing the counter as determined by the state of the UP/DOWN control signal. Special encoding logic within counter 18 determines the X-coordinate and Y-coordinate for selecting the delay through delay circuit 20. The X-coordinate and Y-coordinate from counter 18 identifies a tap point within delay circuit 20 such that the sum of the delay through delay circuit 20 plus the delay through clock distribution tree 22 is equal to the predetermined timing relationship between REFCLK and SYSCLK for providing a known phase relationship between the SYSCLK signal and the clock signals applied at the clock input of flipflop 24 and other like flipflop circuits connected to the plurality of outputs of clock distribution tree 22. Other gate array ASICs may include a phase lock loop like 10 for providing a similar phase relationship for the output signals of clock distribution trees like 22. Therefore, a plurality of clock distribution trees like 22 and associated phase lock loops like 10 maintain the output clock signals thereof substantially in-phase with equal edge transition rates so that flipflops like 24 on the sending and receiving ICs operate synchronously. A further discussion of the interaction between counter 18 and delay circuit 20 is forthcoming.

Figure 2:
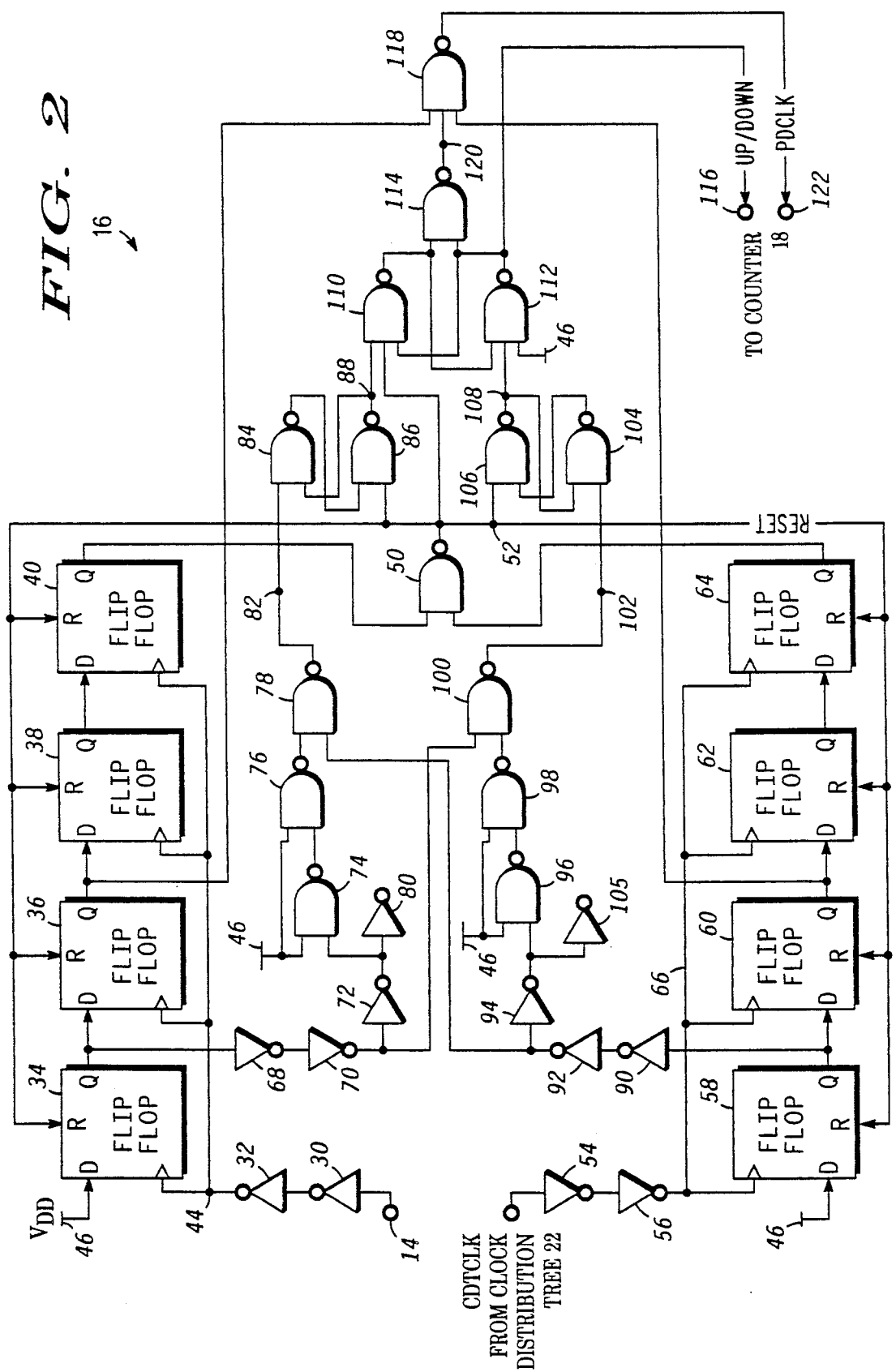
FIG. 2 is a schematic diagram illustrating the preferred embodiment of the phase detector.

Phase detector 16 is revealed in FIG. 2 wherein the SYSCLK signal from input 14 is applied through inverters 30 and 32 to the clock inputs of flipflops 34, 36, 38 and 40 at node 44. A logic one is applied at the D-input of flipflop 34 from power supply conductor 46 typically operating at a positive potential such as $V_{DD}$. The Q-output of flipflop 34 is applied at the D-input of flipflop 36, and the Q-output of flipflop 36 is coupled to the D-input of flipflop 38, while the Q-output of flipflop 38 is coupled to the D-input of flipflop 40. The chain of flipflops 34-40 provides a delay of four periods of the SYSCLK clock signal as the logic one from power supply conductor 46 ripples through flipflops 34, 36, 38 and 40. Thus, every four SYSCLK clock periods a logic one appears at the Q-output of flipflop 40 that is the first input of NAND gate 50. The output of NAND gate 50 is node 52.

The output signal from clock distribution tree 22 applied at the second input of phase detector 16 is routed through inverters 54 and 56 to the clock inputs of flipflops 58, 60, 62 and 64 at node 66 operating as a mirror image of flipflops 34-40. A logic one from power supply conductor 46 is applied at the D-input of flipflop 58 while its Q-output is coupled to the D-input of flipflop 60. The chain continues as the Q-output of flipflop 60 is coupled to the D-input of flipflop 62, and the Q-output of flipflop 62 is coupled to the D-input of flipflop 64, while the Q-output of flipflop 64 is coupled to the second input of NAND gate 50. The logic one applied at the D-input of flipflop 58 ripples through flipflops 58-64 during four periods of the CDTCLK signal producing a logic one at the second input of NAND gate 50 which combines with the logic one from the Q-output of flipflop 40 yielding a logic zero at node 52. The logic zero at node 52 is applied back at the reset inputs of flipflops 34-40 and 58-64 resetting the Q-outputs thereof to logic zero in preparation for the next phase comparison cycle. The Q-output of flipflop 34 is also coupled through serial inverters 68, 70 and 72 to the first input of NAND gate 74. The output of NAND gate 74 is coupled to the first input of NAND gate 76, while the second inputs of NAND gates 74 and 76 are coupled for receiving a logic one from power supply conductor 46. The output of NAND gate 76 is coupled to the first input of NAND gate 78, and the output of NAND gate 78 is coupled to the first input of NAND gate 84 at node 82. The input of inverter 80 is coupled to the output of inverter 72 for providing a known load thereto equal to the loads applied to the inverters of delay circuit 20. NAND gate 86 includes a first input coupled to node 52, a second input coupled to the output of NAND gate 84 and an output coupled to the second input of NAND gate 84 at node 88 for latching the signal from node 82.

In a symmetrical path, the Q-output of flipflop 58 is also coupled through serial inverters 90, 92 and 94 to the first input of NAND gate 96. The delay through inverters 72 and 94 is made equal to the delay through the inverters of delay circuit 20. Also, the delay through inverters 68 and 70 is made equal to the delay through the inverters 90 and 92. The output of NAND gate 96 is coupled to the first input of NAND gate 98, while the second inputs of NAND gates 96 and 98 are coupled for receiving a logic one from power supply conductor 46. The output of inverted 92 is also coupled to the second input of NAND gate 78. The output of NAND gate 98 is coupled to the first input of NAND gate 100, and the output of NAND gate 100 is coupled to the first input of NAND gate 104 at node 102. The output of inverter 70 is coupled to the second input of NAND gate 100. Furthermore, the input of inverter 105 is coupled to the output of inverter 94 for providing a known load thereto equal to the loads applied to the inverters of delay circuit 20. NAND gate 106 includes a first input coupled to node 52, a second input coupled to the output of NAND gate 104 and an output coupled to the second input of NAND gate 104 at node 108 for latching the signal from node 102. The outputs of NAND gates 86 and 106 are coupled to the first inputs of NAND gates 110 and 112, respectively. NAND gate 110 also includes a second input coupled to node 52 and a third input coupled to the first input of NAND gate 114 and to the output of NAND gate 112 for providing the UP/DOWN control signal at node 116. The output of NAND gate 110 is coupled to the second input of NAND gate 114 and to the second input of NAND gate 112, while the third input of NAND gate 112 is coupled for receiving a logic one from power supply conductor 46. NAND gate 118 includes a first input coupled to the Q-output of flipflop 36, a second input coupled to the output of NAND gate 114 at node 120, a third input coupled to the Q-output of flipflop 60 and an output coupled to node 122 for providing the PDCLK clock signal to counter 18.

The operation of phase detector 16 may best be understood in combination with the waveform diagrams of FIGS. 3A-3J, 4A-4J and 5A-5J, one for each of the three cases to be considered. The first case occurs for the out-of-phase condition when the CDTCLK signal from clock distribution tree 22 arrives at least one inverter delay ahead of the SYSCLK clock from input 14. For this first case, phase detector 16 provides phase correction by issuing a logic zero for the UP/DOWN control signal during a first SYSCLK period of the phase comparison cycle while toggling the PDCLK clock signal during a second SYSCLK period of FIG. 3A-3J. The phase comparison cycle lasts four periods of the SYSCLK signal. The second case shown in FIG. 4A-4J also involves an out-of-phase condition although the CDTCLK clock signal now lags (occurring later in time) the SYSCLK clock signal. Phase detector 16 responds with a logic one for the UP/DOWN control signal one period before the PDCLK clock signal transitions for providing phase correction in the opposite direction from that of the first case. The third case shown in FIG. 5A-5J detects when the rising edges of the CDTCLK signal and the SYSCLK signal are within a predetermined window of one another. This is the deadzone window wherein no PDCLK clock signals are produced since the phase difference is less than the resolution of phase detector 16. Without PDCLK transitions, counter 18 remains stagnant and no corrections are made to phase lock loop 10. When the difference of the rising edges of the CDTCLK signal and the SYSCLK signal are within the deadzone window, correction is unnecessary and even undesirable since such an adjustment may over-correct and lead to a phase error in the opposite direction. As will be shown, the deadzone window is less than one inverter delay of delay circuit 20.

The phase comparison cycle begins after a low RESET signal at node 52 resets the Q-outputs of flipflops 34-40 and 58-64 to logic zero, while nodes 52, 82, 88, 102, 108, 120 and 122 are initialized to logic one, and node 116 is set to logic zero. The SYSCLK clock signal operating at say 50 MHz is buffered through inverters 30 and 32 and applied at the clock inputs of flipflops 34-40. Likewise, the CDTCLK clock signal from clock distribution tree 22 is buffered through inverters 54 and 56 and applied at the clock inputs of flipflops 58-64. Inverters 30-32 and 54-56 provide equal edge transition rates for the SYSCLK and CDTCLK signals. The logic zeroes at the Q-outputs of flipflops 58 and 34 drive the outputs of inverters 92 and 70 to logic zero such that the outputs of NAND gates 98 and 76 are logic one and nodes 82 and 102 are logic one at the beginning of the phase comparison cycle. Inverters 68-72 and NAND gates 74-78 comprise a first symmetrical propagation path through phase detector 16 wherein the second input of NAND gate 78 waits for a logic one from the output of inverter 92 for producing a logic zero at node 82 indicating that the CDTCLK signal leads the SYSCLK signal as demonstrated in FIG. 3A-3J. Likewise, inverters 90-94 and NAND gates 96-100 comprise a second symmetrical propagation path through phase detector 16 wherein the second input of NAND gate 100 waits for a logic one from the output of inverter 70 for producing a logic zero at node 102 indicating that SYSCLK leads CDTCLK as shown in FIG. 4A-4J. If both the first and second symmetrical paths of phase detector 16 trip and produce logic zeroes at nodes 82 and 102 as in FIG. 5A-5J, then CDTCLK and SYSCLK are within the deadzone window. No phase correction is initiated and the PDCLK signal is disabled. It is important that the first and second symmetrical paths be matched in terms of propagation delay for proper operation of phase detector 16. The timing diagrams in FIGS. 3A-3J, 4A-4J and 5A-5J are not necessarily shown to scale although it is assumed that the time difference $t_1-t_0$ in FIGS. 3A-3J and 4A-4J is slightly longer that one inverter delay, e.g. inverter 72 or 94, for the phase difference to be outside the deadzone window.

Figure 3:
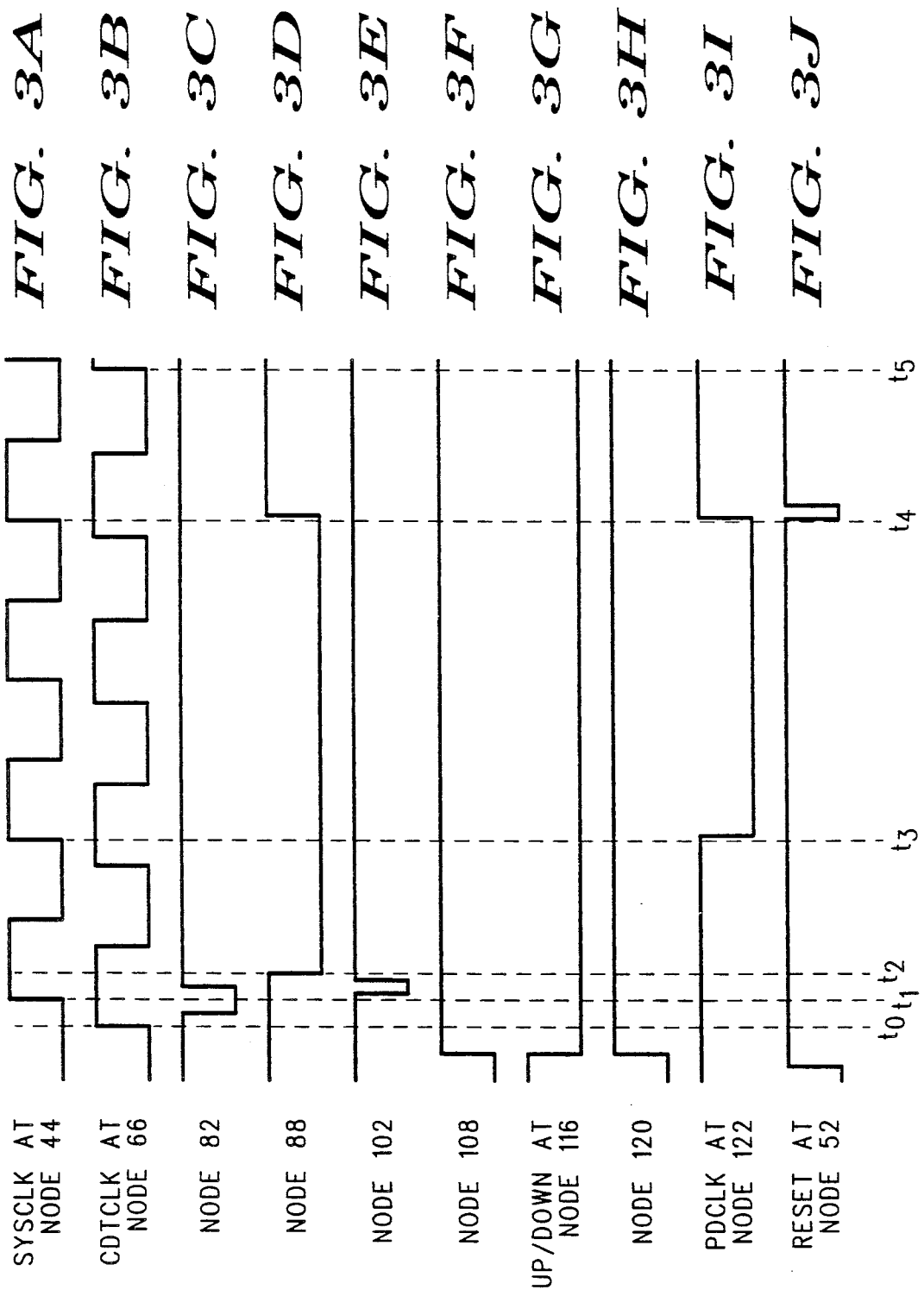
FIGS. 3(a-j), 4(a-j) and 5(a-j) are waveform plots useful in the explanation of the phase detector.

The first case under consideration is illustrated in FIG. 3A-3J- wherein CDTCLK leads SYSCLK by at least one inverter delay. Referring to FIG. 3A-3B, the Q-output of flipflop 58 changes state to logic one with the rising edge of CDTCLK at time $t_0$, while the Q-output of flipflop 34 becomes logic one after the SYSCLK signal transitions at time $t_1$. After two inverter delays through inverters 90 and 92, the logic one arrives at the second input of NAND gate 78 and combines with the initial logic one from the output of NAND gate 76 for producing the logic zero at node 82 in FIG. 3C. Meanwhile, the logic one at the Q-output of flipflop 34 after time $t_1$ propagates to the output of inverter 70 and drives the output of NAND gate 74 to logic one and the output of NAND gate 76 to a logic zero thereby returning the state of node 82 to logic one. The delay between the logic one at the output of inverter 70 and the logic one at the output of inverter 92 is the same as the phase difference between SYSCLK and CDTCLK. The logic zero pulse at node 82 lasts for the delay difference between the logic ones at the outputs of inverters 70 and 92 plus the delay of inverter 72 plus the delay of NAND gates 74 and 76. The delay through NAND gates 74-76 is made equal to the delay though NAND gates 84-86. Therefore, the two NAND gate delay is the minimum time to latch the logic zero from node 82 through NAND gate latch 84-86 to node 88 at time $t_2$ in FIG. 3D. The pulse width at node 82 is wider than the minimum to latch NAND gates 84-86 by the delay of inverter 72 plus the phase difference between the logic ones at the outputs of inverters 70 and 92 (at least one inverter delay). Hence, the first symmetrical path (68-78) through phase detector 16 has detected a phase lead for CDTCLK and latched a logic zero at node 88 accordingly.

For the second symmetrical path (90-100) the logic one at the output of inverter 70 may produce a logic zero at node 102 as shown in FIG. 3E. However, the logic one from the output of inverter 92 also drives the output of NAND gate 96 to logic one and the output of NAND gate 98 to a logic zero thereby pulling node 102 back to logic one. As long as the CDTCLK signal remains at least one inverter delay ahead of the SYSCLK signal, the logic zero from the output of inverter 94 propagates to the output of NAND gate 98 before the logic one from the output of inverter 70 can maintain a logic zero at node 102 for the two NAND gate delays needed for NAND gate latch 104-106. There is insufficient time for NAND gates 104 and 106 to latch the logic zero from node 102, therefore, node 108 remains as the initial logic one as per FIG. 3F. Moreover, if the phase lead for CDTCLK is greater than an inverter delay plus two NAND gate delays, node 102 remains at logic one during the entire phase comparison cycle since the logic zero at the output of inverter 94 arrives at the output of NAND gate 98 before inverter 70 can issue a logic one. The output of NAND gate 110 goes to a logic one with the logic zero from node 88, while the logic ones from node 108, power supply conductor 46 and the output of NAND gate 110 keep node 116 at logic zero for the UP/DOWN control signal indicating a phase lead for the CDTCLK signal as shown in FIG. 3G. The logic zero at node 116 maintains node 120 at a logic one as in FIG. 3H. Thus during the first period of the SYSCLK signal, the UP/DOWN control signal is established as a logic zero with adequate settling time for counter 18 and the logic one at node 120 is positioned for the next SYSCLK period for activating the PDCLK signal. The control signals are latched and stable after the detection.

The Q-outputs of flipflops 60 and 36 transition to logic ones at the second rising edges of CDTCLK and SYSCLK, respectively, during the phase comparison cycle. With three logic ones at the inputs of NAND gate 118, the PDCLK signal falls to logic zero after time $t_3$ in FIG. 3I thereby passing a clock signal to counter 18 for initiating a phase correction in accordance with the UP/DOWN control signal. During the third period of the SYSCLK signal, flipflops 38 and 62 provide further delay allowing settling time for counter 18 and delay circuit 20 before beginning the next phase comparison cycle. That is, flipflops 38 and 62 lengthen the phase comparison cycle for one period so as to avoid timing problems and potential race conditions. This allows the three macros containing phase detector 16, counter 18 and delay circuit 20, respectively, to be disposed on the gate array in convenient areas without concern for signal propagation and timing problems. It is understood that more flipflops like 38 and 62 may be serially coupled in the flipflop string 34-40 and 58-64 for providing additional delay as might be required for a wider counter and longer delay lines. Indeed, flipflops like 38 and 62 may be connected external to the phase detector macro from the gate array library by bringing out appropriate control lines like nodes 44 and 52 thereby allowing a standard phase detector macro with say one or two flipflop delays (38, 62) while still providing flexibility for increasing the phase comparison cycle. Thus, a predetermined delay is established between times $t_3$ and $t_4$ allowing adequate settling time for the signals propagating through counter 18 and delay circuit 20 such that the next phase comparison cycle reflects the most recent update. Notice the phase difference between CDTCLK and SYSCLK is decreased between times $t_3$ and $t_4$ illustrating an actual phase correction by counter 18 and delay circuit 20, further discussion forthcoming.

About time $t_4$ at the fourth rising edges of the CDTCLK and SYSCLK signals, the Q-outputs of flipflops 40 and 64 become logic ones whereby node 52 falls to logic zero resetting flipflops 34–40 and 58–64 to logic zero, nodes 52, 82, 88, 102, 108, 120 and 122 to logic one, and node 116 to logic zero. Node 52 returns to logic one after the Q-outputs of flipflops 40 and 64 zeroize in preparation for the next phase comparison cycle beginning at time $t_5$. Recapping the aforedescribed phase comparison and correction cycle for the first case under consideration, there was a sufficient phase lead (one inverter delay) for the CDTCLK signal to latch a logic zero at node 88 during the first period of the SYSCLK signal while cutting the pulse width of the low signal at node 102 short and keeping the logic one at node 108. The logic zero-logic one combination at nodes 88 and 108, respectively, provides a logic zero for the UP/DOWN control signal and allows the second period of the SYSCLK signal to activate the PDCLK signal and initiate a phase correction in counter 18 and delay circuit 20. The third period of the SYSCLK signal provides settling time for the phase correction operation. Additional delay periods may be achieved with more serially coupled flipflops like 38 and 62. The fourth period of the SYSCLK signal resets phase detector 16 in preparation for the next phase comparison cycle.

Figure 4:
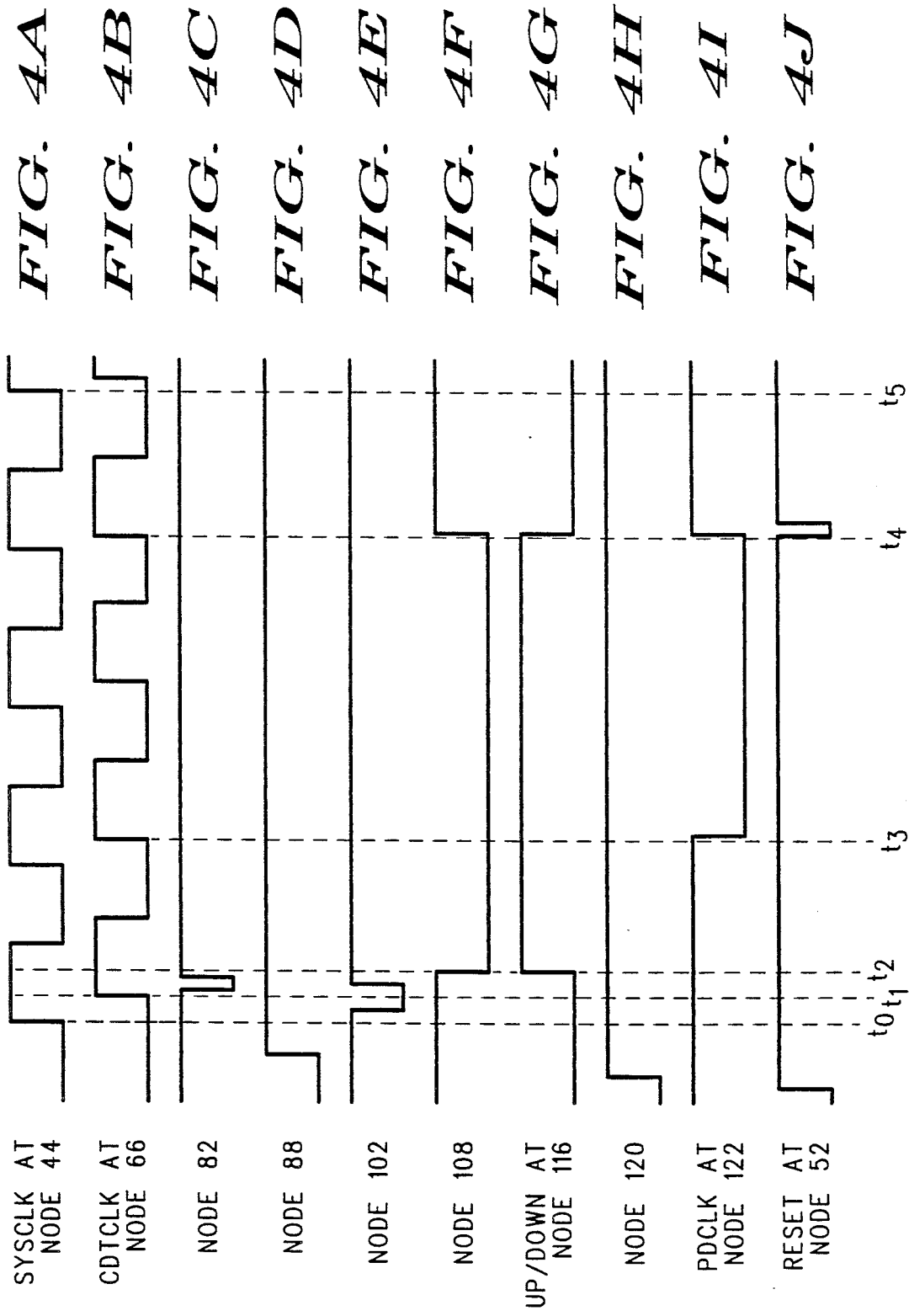

The second case under consideration is illustrated in FIG. 4A–4J wherein SYSCLK leads CDTCLK by at least one inverter delay. The phase comparison cycle begins after a low RESET signal at node 52 resets the Q-outputs of flipflops 34–40 and 58–64 to logic zero, while nodes 52, 82, 88, 102, 108, 120 and 122 are initialized to logic one, and node 116 is set to logic zero. Again the logic zeroes at the Q-outputs of flipflops 34 and 58 drive the outputs of inverters 70 and 92 to logic zero such that the outputs of NAND gates 76 and 98 are logic one and nodes 82 and 102 are logic one at the beginning of the phase comparison cycle. Referring to FIG. 4A–4B, the Q-output of flipflop 34 changes state to logic one with the rising edge of SYSCLK at time $t_0$, while the Q-output of flipflop 58 becomes logic one after the CDTCLK signal transitions at time $t_1$. After two inverter delays through inverters 68 and 70, the logic one arrives at the second input of NAND gate 100 and combines with the initial logic one from the output of NAND gate 98 for producing the logic zero at node 102 in FIG. 4E. Meanwhile, the logic one from the Q-output of flipflop 58 after time $t_1$ propagates to the output of inverter 92 and drives the output of NAND gate 96 to logic one and the output of NAND gate 98 to a logic zero thereby returning the state of node 102 to logic one. The logic zero pulse at node 102 lasts for the delay difference between the logic ones at the outputs of inverters 70 and 92 plus the delay of inverter 94 plus the delay of NAND gates 96 and 98. The delay through NAND gates 96–98 is made equal to the delay though NAND gates 104–106. Therefore, the two NAND gate delay is the minimum time to latch the logic zero from node 102 through NAND gate latch 104–106 to node 108 at time $t_2$ in FIG. 4F. The pulse width at node 102 is wider than the minimum to latch NAND gates 104–106 by the delay of inverter 94 plus the phase difference between the logic ones at the outputs of inverters 70 and 92 (at least one inverter delay). Hence, the second symmetrical path (90–100) through phase detector 16 has detected a phase lead for SYSCLK and latched a logic zero at node 108 accordingly.

For the first symmetrical path (68–78) the logic one at the output of inverter 92 may produce a logic zero at node 82 as shown in FIG. 4C. However, the logic one at the output of inverter 70 also drives the output of NAND gate 74 to logic one and the output of NAND gate 76 to a logic zero thereby pulling node 82 back to logic one. As long as the SYSCLK signal remains at least one inverter delay ahead of the CDTCLK signal, the logic zero from the output of inverter 72 propagates to the output of NAND gate 76 before the logic one from the output of inverter 92 can maintain a logic zero at node 82 for the two NAND gate delays needed for NAND gate latch 84–86. There is insufficient time for NAND gates 84 and 86 to latch the logic zero from node 82, therefore, node 88 remains as the initial logic one as in FIG. 4D. Moreover, if the phase lead for SYSCLK is greater than an inverter delay plus two NAND gate delays, node 82 remains at logic one during the entire phase comparison cycle since the logic zero at the output of inverter 72 arrives at the output of NAND gate 76 before inverter 92 can issue a logic one. The logic zero from node 108 drives node 116 to logic one for the UP/DOWN control signal indicating a phase lead for the SYSCLK signal as shown in FIG. 4G, while the output of NAND gate 110 goes to a logic zero with the logic ones from node 88, node 52 and the output of NAND gate 112. The logic zero at the output of NAND gate 110 maintains node 120 at a logic one as in FIG. 4H. Thus during the first period of the CDTCLK signal, the UP/DOWN control signal is established as a logic one with adequate settling time for counter 18 and the logic one at node 120 is positioned for the next CDTCLK period for activating the PDCLK signal.

The Q-outputs of flipflops 36 and 60 transition to logic ones at the second rising edges of SYSCLK and CDTCLK, respectively, during the phase comparison cycle. With three logic ones at the inputs of NAND gate 118, the PDCLK signal falls to logic zero after time $t_3$ in FIG. 4I thereby passing a clock signal to counter 18 for initiating a phase correction. Again during the third period of the CDTCLK signal, flipflops 38 and 62 provide further delay allowing settling time for counter 18 and delay circuit 20 before the next phase comparison cycle begins at time $t_5$. Thus, a predetermined delay is established between times $t_3$ and $t_4$ allowing adequate settling time for the signals propagating through counter 18 and delay circuit 20 such that the next phase comparison cycle reflects the most recent update. Again notice the phase difference between CDTCLK and SYSCLK decreases between times $t_3$ and $t_4$ illustrating an actual phase correction by counter 18 and delay circuit 20.

About time $t_4$ at the fourth rising edges of the CDTCLK and SYSCLK signals, the Q-outputs of flipflops 40 and 64 become logic ones whereby node 52 falls to logic zero resetting flipflops 34–40 and 58–64 to logic zero, nodes 52, 82, 88, 102, 108, 120 and 122 to logic one, and node 116 to logic zero. Node 52 returns to logic one after the Q-outputs of flipflops 40 and 64 zeroize in preparation for the next phase comparison cycle beginning at time $t_5$. Again recapping the phase comparison and correction cycle for the second case, there was a sufficient phase lead (one inverter delay) for the SYSCLK signal to latch a logic zero at node 108 during the first period of the CDTCLK signal while limiting the low pulse width at node 82 to keep the logic one at node 88. The logic one-logic zero combination at nodes 88 and 08, respectively, provides a logic one for the UP/DOWN control signal and allows the second period of the CDTCLK signal to activate the PDCLK signal and initiate a phase correction in counter 18 and delay circuit 20. The third period of the CDTCLK signal provides settling time for the phase correction operation while additional delay periods may be achieved with more serially coupled flipflops like 38 and 2. The fourth period of the CDTCLK signal resets phase detector 16 in preparation for the next phase comparison cycle.

Figure 5:
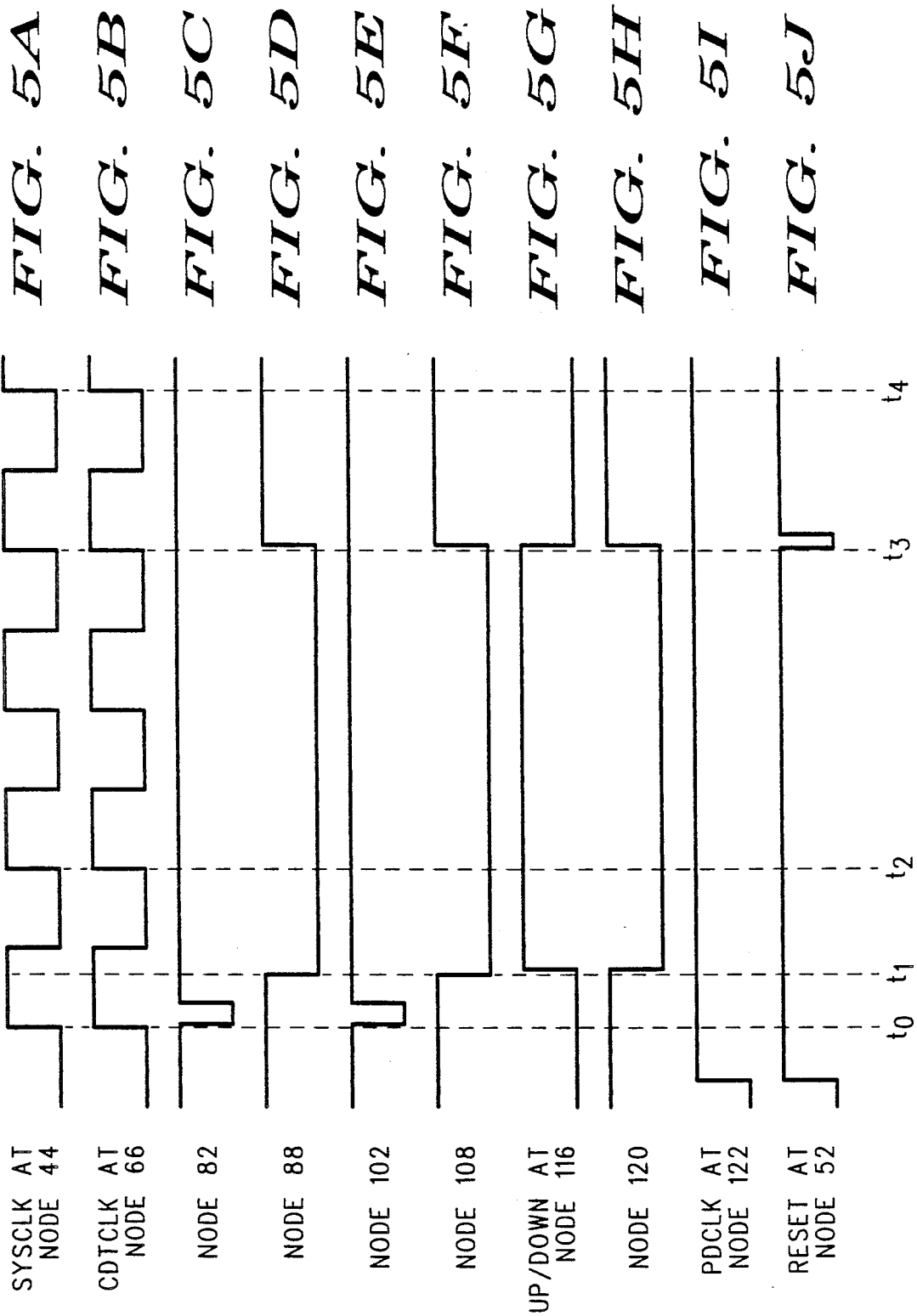

The third and final case under consideration is illustrated in FIG. 5A–5J wherein the SYSCLK and CDTCLK signals are within the deadzone window (one inverter delay of one another). Phase detector 16 still performs a phase comparison although the phase correction is inhibited. Again the phase comparison cycle begins after a low RESET signal at node 52 resets the Q-outputs of flipflops 34–40 and 58–64 to logic zero, while nodes 52, 82, 88, 102, 108, 120 and 122 are initialized to logic one, and node 116 is set to logic zero. The logic zeroes at the Q-outputs of flipflops 34 and 58 drive the outputs of inverters 70 and 92 to logic zero such that the outputs of NAND gates 76 and 98 are logic one and nodes 82 and 102 are logic one at the beginning of the phase comparison cycle. Referring to FIG. 5A–5B, the Q-outputs of flipflops 34 and 58 change state to logic one with the rising edges of SYSCLK and CDTCLK signal at time $t_0$. After two inverter delays through inverters 90 and 92, the logic one arrives at the second input of NAND gate 78 and combines with the initial logic one at the output of NAND gate 76 for producing a logic zero at node 82 in FIG. 5C at time $t_1$. Likewise after two inverter delays through inverters 68 and 70, the logic one arrives at the second input of NAND gate 100 and combines with the initial logic one at the output of NAND gate 98 for producing a logic zero at node 102 as in FIG. 5D. The logic one at the output of inverter 70 also drives the output of NAND gage 74 to logic one and the output of NAND gate 76 to a logic zero thereby returning the state of node 82 to logic one, while the logic one at the output of inverter 92 drives the output of NAND gate 96 to logic one and the output of NAND gate 98 to a logic zero also returning the state of node 102 to logic one. The logic zero pulse at node 82 lasts for the delay difference between the logic ones at the outputs of inverters 70 and 92 plus the delay of inverter 72 plus the delay of NAND gates 74 and 76. The same is true for the logic zero at node 102. Recall that two NAND gate delays are needed to latch the low pulses from nodes 82 and 102 to nodes 88 and 108. Thus, the delay through inverters 72 and 94 control the deadzone window. Hence, the first and second symmetrical paths (68–78, 90–100) through phase detector 16 have latched logic zeroes at both nodes 88 and 108.

The output of NAND gate 110 goes to logic one with the logic zero from node 88, while the logic zero from node 108 drives node 116 to logic one for the UP/-DOWN control signal as shown in FIG. 5G. The logic ones at the output of NAND gates 110 and 112 drive node 120 to a logic zero in FIG. 5H. Thus during the first period of the SYSCLK signal, the UP/DOWN control signal is established as a logic one although this is immaterial since the logic zero at node 120 serves to disable the PDCLK signal during the second period of the phase comparison cycle which inhibits the update to counter 18 and corresponding phase correction. The Q-outputs of flipflops 60 and 36 transition to logic ones at the second rising edges of CDTCLK and SYSCLK; however, the PDCLK signal remains logic one in FIG. 5I due to the logic zero at node 120. Without a fall edge from the PDCLK signal, counter 18 is not clocked and the phase correction portion of the cycle cannot proceed. About time $t_4$ at the fourth rising edges of the CDTCLK and SYSCLK signals, the Q-outputs of flipflops 40 and 64 become logic ones whereby node 52 falls to logic zero resetting flipflops 34–40 and 58–64 to logic zero, nodes 52, 82, 88, 102, 108, 120 and 122 to logic one, and node 116 to logic zero. Node 52 returns to logic one after the Q-outputs of flipflops 40 and 64 zeroize in preparation for the next phase comparison cycle beginning at time $t_5$.

In a gate array application, phase detector 16 is typically constrained to single geometry P-channel and N-channel transistors. The first and second symmetrical propagation paths through phase detector 16 are well suited to a standard geometry design wherein such key components may be matched to create delays necessary to make an accurate deadzone window within which phase detector 16 ignores the phase differential between the SYSCLK and CDTCLK signals. The accuracy of phase lock loop 10 of FIG. 1 is determined by a single inverter delay of delay circuit 20, hence, phase detector 16 must have resolution greater than the inverter delay which is approximately 200–400 picoseconds. The pipeline approach of generating an UP/DOWN control signal during one period of the SYSCLK signal and the PDCLK during another period and then providing one or more additional periods for propagation delays through counter 18 and delay circuit 20 allows the phase detector macro to be conveniently disposed on the gate array without concern for timing problems and race condition. The pipeline may be increased as needed with more flipflops like 38 and 62 for providing sufficient settling time for counter 18 and delay circuit 20 such that phase detector 16 operates with the most recent update for each phase comparison cycle thereby preventing under-corrections and over-corrections.

Turning to FIG. 6, there is shown further detail of counter 18 including up/down counter 130 having a clock input coupled for receiving the PDCLK clock signal from phase detector 16 and a control input for receiving the UP/DOWN control signal also from phase detector 16. Up/down counter 130 should be at least six bits wide for providing the 3-bit X-coordinate and 3-bit Y-coordinate output signals for controlling an eight-by-eight tap point delay matrix of delay circuit 20. It is understood that up/down counter 130 may be increased in size to accommodate larger delay lines. For example, the available delay may be increased two fold by increasing counter 18 one bit ($Q_6$), duplicating delay circuit 20 and connecting the output of one delay circuit to the input of the other (not shown). The outputs of both delay circuits would be coupled though a multiplexer operating under control of the most significant counter bit $Q_6$ for alternating between delay circuits. For the 3-bit X-coordinate and 3-bit Y-coordinate configuration, the least significant count bit $Q_0$ provides the most significant bit $Y_2$ of the Y-coordinate control signal, and the most significant count bit $Q_5$ provides the second most significant bit $Y_1$, while the second most significant count bit $Q_4$ is the least significant bit $Y_0$ of the Y-coordinate control signal. Count bits $Q_1$, $Q_2$ and $Q_3$ are applied to the first inputs of exclusive-OR gates 132, 134 and 136, respectively, while the second inputs of the same are coupled for receiving count bit $Q_4$. The outputs of exclusive-OR gates 132-136 provide the X-coordinate bits $X_0$, $X_1$ and $X_2$, respectively. A representative sample of the values of up/down counter 130 with the operating states of X-coordinate and Y-coordinate signals is tabulated in Table 1 as follows.

TABLE 1

| Operating States of Counter 18 | | | | | | | | | | | |
|---|---|---|---|---|---|---|---|---|---|---|---|
| Counter values | | | | | | X-coordinate | | | Y-coordinate | | |
| $Q_5$ | $Q_4$ | $Q_3$ | $Q_2$ | $Q_1$ | $Q_0$ | $X_2$ | $X_1$ | $X_0$ | $Y_2$ | $Y_1$ | $Y_0$ |
| 0 | 0 | 0 | 0 | 0 | 0 | 0 | 0 | 0 | 0 | 0 | 0 |
| 0 | 0 | 0 | 0 | 0 | 1 | 0 | 0 | 0 | 1 | 0 | 0 |
| 0 | 0 | 0 | 0 | 1 | 0 | 0 | 0 | 1 | 0 | 0 | 0 |
| 0 | 0 | 0 | 0 | 1 | 1 | 0 | 0 | 1 | 1 | 0 | 0 |
| 0 | 0 | 0 | 1 | 0 | 0 | 0 | 1 | 0 | 0 | 0 | 0 |
| 0 | 0 | 0 | 1 | 0 | 1 | 0 | 1 | 0 | 1 | 0 | 0 |
| 0 | 0 | 0 | 1 | 1 | 0 | 0 | 1 | 1 | 0 | 0 | 0 |
| 0 | 0 | 0 | 1 | 1 | 1 | 0 | 1 | 1 | 1 | 0 | 0 |
| . | . | . | . | . | . | . | . | . | . | . | . |
| 0 | 0 | 1 | 1 | 1 | 0 | 1 | 1 | 1 | 0 | 0 | 0 |
| 0 | 0 | 1 | 1 | 1 | 1 | 1 | 1 | 1 | 1 | 0 | 0 |
| 0 | 1 | 0 | 0 | 0 | 0 | 1 | 1 | 1 | 0 | 0 | 1 |
| 0 | 1 | 0 | 0 | 0 | 1 | 1 | 1 | 1 | 1 | 0 | 1 |
| 0 | 1 | 0 | 0 | 1 | 0 | 1 | 1 | 0 | 0 | 0 | 1 |
| 0 | 1 | 0 | 0 | 1 | 1 | 1 | 1 | 0 | 1 | 0 | 1 |
| . | . | . | . | . | . | . | . | . | . | . | . |
| 0 | 1 | 1 | 1 | 1 | 0 | 0 | 0 | 0 | 0 | 0 | 1 |
| 0 | 1 | 1 | 1 | 1 | 1 | 0 | 0 | 0 | 1 | 0 | 1 |
| 1 | 0 | 0 | 0 | 0 | 0 | 0 | 0 | 0 | 0 | 1 | 0 |
| 1 | 0 | 0 | 0 | 0 | 1 | 0 | 0 | 0 | 1 | 1 | 0 |
| 1 | 0 | 0 | 0 | 1 | 0 | 0 | 0 | 1 | 0 | 1 | 0 |
| 1 | 0 | 0 | 0 | 1 | 1 | 0 | 0 | 1 | 1 | 1 | 0 |
| . | . | . | . | . | . | . | . | . | . | . | . |
| 1 | 0 | 1 | 1 | 1 | 0 | 1 | 1 | 1 | 0 | 1 | 0 |
| 1 | 0 | 1 | 1 | 1 | 1 | 1 | 1 | 1 | 1 | 1 | 0 |
| 1 | 1 | 0 | 0 | 0 | 0 | 1 | 1 | 1 | 0 | 1 | 1 |
| 1 | 1 | 0 | 0 | 0 | 1 | 1 | 1 | 1 | 1 | 1 | 1 |
| 1 | 1 | 0 | 0 | 1 | 0 | 1 | 1 | 0 | 0 | 1 | 1 |
| 1 | 1 | 0 | 0 | 1 | 1 | 1 | 1 | 0 | 1 | 1 | 1 |
| . | . | . | . | . | . | . | . | . | . | . | . |
| 1 | 1 | 1 | 1 | 1 | 0 | 0 | 0 | 0 | 0 | 1 | 1 |
| 1 | 1 | 1 | 1 | 1 | 1 | 0 | 0 | 0 | 1 | 1 | 1 |

Figure 7:
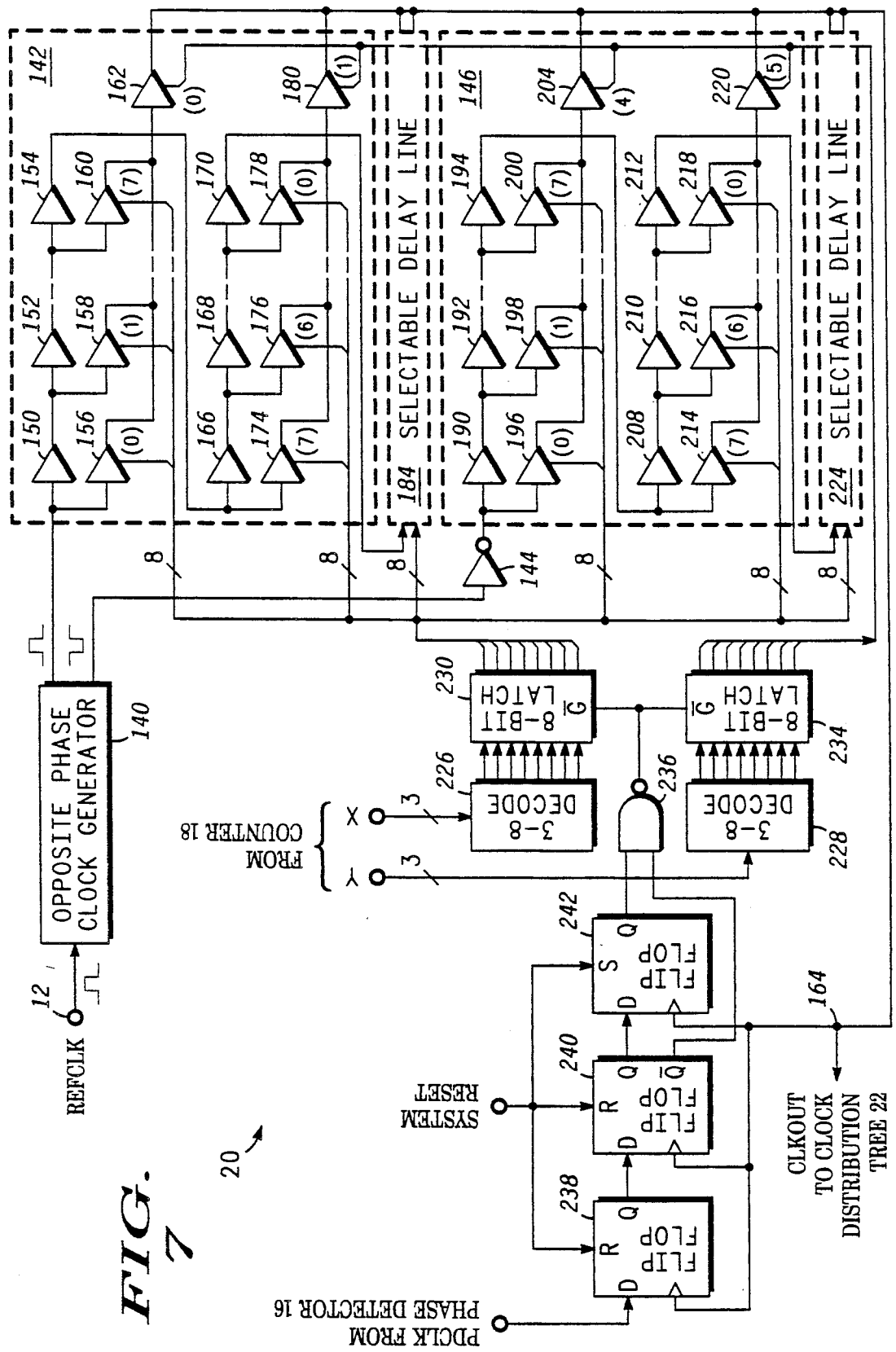
FIG. 7 is a schematic diagram illustrating one embodiment of the selectable delay circuit.

In FIG. 7, delay circuit 20 is shown including opposite phase clock generator 140 coupled for receiving the REFCLK reference clock from input 12 and providing a first clock signal operating at frequency and in-phase with REFCLK at a first output and a second clock signal operating at frequency and 180 degrees out-of-phase from REFCLK at a second output. A circuit for generating opposite phase clocks with standard geometry transistors in a gate array is demonstrated in FIG. 9. The first output of opposite phase clock generator 140 is coupled to delay line 142 while the second output having the opposite phase clock is complemented through inverter 144 to delay line 146. Delay line 142 includes a string of eight serially coupled buffers, like buffers 150, 152 and 154, the inputs of which (tap points) are respectively coupled to the inputs of eight tri-state buffers like 156, 158 and 160 defining the tap points of delay line 142. The outputs of tri-state buffers 156-160 are commonly connected through tri-state buffer 162 to the CLKOUT output of delay circuit 20 at node 164. Each of buffers 150-160 may be implemented as two serially coupled inverters and each inverter is loaded with another inverter for providing a known load thereto. The output of buffer 154 feeds another string of eight serially coupled buffers including buffers 166, 168 and 170. Again, the inputs of the string of eight buffers 166-170 (tap points) are respectively coupled to the inputs of eight tri-state buffers like 174, 176 and 178, while the outputs of tri-state buffers 174-178 are coupled together through tri-state buffer 180 to node 164. The circuit described for buffers 150-180 is repeated in delay line 184, wherein the output of buffer 170 is coupled to the input of buffer string like 150-170 of delay line 184. The outputs of tri-state buffers like 162 and 180 of delay line 184 are coupled to node 164.

In a like manner, delay line 146 includes a string of eight serially coupled buffers like buffers 190, 192 and 194. The inputs of the string of eight buffers 190-194 (tap points) are respectively coupled to the inputs of eight tri-state buffers like 196, 198 and 200, the outputs of which are commonly connected through tri-state buffer 204 to node 164. The output of buffer 194 is coupled to another string of eight serially coupled buffers including buffers 208, 210 and 212. The inputs of the string of eight buffers 208-212 (tap points) are respectively coupled to the inputs of eight tri-state buffers like 214, 216 and 218, while the outputs of tri-state buffers 214-218 are coupled together through tri-state buffer 220 to node 164. Each of buffers 190-218 may also be implemented as two serially coupled inverters. A delay line 224 is constructed in a like manner to that of delay line 146, wherein the output of buffer 212 is coupled to the input of buffer string like 190-212 of delay line 224. The outputs of tri-state buffers like 162 and 180 of delay line 224 are coupled to node 164.

To control tri-state buffers 156-218, delay circuit 20 receives the 3-bit X-coordinate and 3-bit Y-coordinate control signals from counter 18 at the inputs of 3-to-8 decode circuits 226 and 228, respectively. A control signal of "000" decodes to "00000001" while a "100" decodes to "00010000" and "111" decodes to "10000000" in a conventional manner. The output signals of 3-to-8- decode circuits 226 and 228 propagate through 8-bit latches 230-234 at the falling edge of the output signal of NAND gate 236 originating from the PDCLK clock signal as provided by phase comparator 16 and latched at the rising edge of the same. The PDCLK signal is applied at the D-input of flipflop 238 while the Q-output of the same is coupled to the D-input of flipflop 240. Likewise, the Q-output of flipflop 240 is applied at the D-input of flipflop 242, and the Q-output of flipflop 242 is coupled to the first input of NAND gate 236. The inverted $\overline{Q}$-output of flipflop 240 is coupled to the second input of NAND gate 236, and node 164 is coupled to the clock inputs of flips 238, 240 and 242. The Q-outputs of flipflops 238 and 240 are reset to logic zero and flipflop 242 is set to a logic one by a system reset signal which occurs only once during system initialization.

The output signals of 8-bit latch 230 provide the control signals for tri-state buffers 156-160, 174-178, 196-200 and 214-218 and like buffer in delay lines 184 and 224. For example, the least significant bit (0) of 8-bit latch 230 from the encoded X-coordinate control signal is applied at the control input of tri-state buffer 156, while the second least significant bit (1) is applied at the control input of tri-state buffer 158 and so on through the most significant bit (7) of 8-bit latch 230 which is applied at the control input of tri-state buffer 160. The order is reversed for tri-state buffers 174–178, wherein the most significant bit (7) of 8-bit latch 230 is applied at the control input of tri-state buffer 174, while the second most significant bit (6) is applied at the control input of tri-state buffer 176, and the least significant bit (0) of 8-bit latch 230 is applied at the control input of tri-state buffer 178. The aforedescribed connections between -8 bit latch 230 and delay line 142 are repeated for the respective tri-state buffers of delay lines 184, 146 and 224. The output signals of 8-bit latch 234 are applied at the control inputs of tri-state buffers 162, 180, 204 and 220 and similar tri-state buffers in delay lines 184 and 224. Tri-state buffer 162 receives the least significant bit (0) of 8-bit latch 234 from the encoded Y-coordinate control signal, while the control input of tri-state buffer 180 receives the second least significant bit (1). The tri-state buffers like 162 and 180 of the delay line 184 receives the third and fourth least significant bits (2) and (3) of 8-bit latch 234, and the control inputs of tri-state buffers 204 and 220 receive the fifth and sixth least significant bits (4) and (5) as shown. The control inputs of tri-state buffers like 204 and 220 of delay line 224 receive the upper two most significant bits (6) and (7) of 8-bit latch 234. The important difference between delay lines 142 and 146 is the offset delay provided by inverter 144. Recall that the output signals of opposite phase clock generator 140 are substantially 180 degrees out-of-phase. The encoded value of counter 18 is set up such that incrementing or decrementing the count value by one alternates the conduction path through delay circuit 20 between delay lines 142 and 146 (or 184 and 224). With one inverter offset therebetween, instead of shifting one full buffer delay say from buffer 150 to buffer 152 which is two inverter delays, the delay is changed only one inverter delay from buffer 150 to buffer 190.

For example, assume a value in up/down counter 130 of "000000" corresponding to bits $Q_5$–$Q_0$, respectively, from a previous phase comparison cycle. From Table I, the encoded X-coordinate is thus "000" and the Y-coordinate is also "000". The X-coordinate and Y-coordinate values "000" produced a "00000001" at the outputs of 3-to-8 decode circuits 226 and 228 where each is latched into 8-bit latches 230 and 234 thereby enabling tri-state buffers 156, 162, 178, 196 and 218 and like tri-state buffers in delay lines 184 and 224. A propagation path from the first (in-phase) output of opposite phase clock generator circuit 140 is established through tri-state buffers 156 and 162 to node 164. The remaining conduction paths through delay lines 142, 146, 184 and 224 are disabled by tri-state buffers 180, 204 and 220 and the like since the Y-coordinate control signal enables only tri-state buffer 162 of delay line 142. Therefore, even though opposite phase clock generator 140 is continuously operating as are delay lines 142, 146, 184 and 224 in response to the X-coordinate control signal, only one delayed REFCLK gets through to node 164 as determined by the Y-coordinate control signal.

After the next phase comparison cycle, say the count value is incremented to "000001". Again from Table 1, the encoded X-coordinate is "000" and the Y-coordinate is "000". The X-coordinate latches a "00000001" into -8 bit latch 230 and the Y-coordinate latches a "00010000" into 8-bit latch 234 thereby enabling the propagation path from the second (complementary phase) output of opposite phase clock generator circuit 140 through tri-state buffers 196 and 204 to node 164. Again the remaining conduction paths through delay lines 142, 146, 184 and 224 are disabled by tri-state buffers 162, 180 and 220 and the like since the Y-coordinate control signal enables only tri-state buffer 204 of delay line 146. Thus by changing the value of up/down counter 130 from "000000" to "000001", the delay through delay circuit 20 increases from a fixed minimum delay (opposite phase clock generator 140 plus two tri-state buffers like 156 and 162) to the same fixed minimum delay plus one inverter delay (144). Incrementing up/down counter 130 to the next value of "000010" enables tri-state buffers 158 and 162 with an X-coordinate of "001" and Y-coordinate of "000" thereby providing two inverter delays through buffer 150 plus the fixed minimum delay, and yet another value of "000011" enables tri-state buffers 198 and 20<with an X-coordinate of "001" and Y-coordinate of "000" thereby providing three inverter delays through inverter 144 and buffer 190 plus the fixed minimum delay. By now it should be clear that the delay through delay circuit 20 increases one inverter delay with each increment of up/down counter 130. Thus, delay circuit 20 provides single inverter resolution which reduces jitter for phase lock loop 10.

One notable feature of delay lines 142–224 is the common encoded X-coordinate assignment for adjacent tri-state buffers such as 160 and 174 which are both controlled by bit (7) of 8-bit latch 230. This arrangement relates back to the exclusive-OR encoding logic of counter 18 wherein the X-coordinate control signal counts from "000" through "111" and back to "000" as the counter value increment from "000000" through "110000" to "1111111" For example, with a counter value of "001110" and a corresponding X-coordinate "111" and Y-coordinate "000", the conduction path through seven buffers including buffers 150–152 and tri-state buffers 160–162 are enabled. The next count value "001111" enables the conduction path through seven buffers including buffers 190–92 and tri-state buffers 200–204. One more count "110000" switches back to delay line 142 and enables the conduction path through buffers 150–154 and tri-state buffers 174 and 180; one inverter delay longer than the previous count "001111". One more count "110001" switches back to delay line 146 and enables the conduction path through buffers 190194 and tri-state buffers 214 and 220; one inverter delay longer than the previous count "110000". By moving the tap point one inverter delay and synchronizing PDCLK with CLKOUT, the CLKOUT signal is stable at both adjacent taps allowing the change in delay to be applied without glitching the clock.

Consider a comprehensive example of phase lock loop 10 for one phase comparison and correction cycle. Assume a count value of "110000" and X-coordinate of "111" and Y-coordinate of "001" from Table 1. The REFCLK clock signal is delayed through buffer 150–154 and tri-state buffers 174 and 180 and then further delayed through clock distribution tree 22 thereby becoming the CDTCLK signal applied at the second input of phase detector 16. Further assume the first case is in effect wherein CDTCLK leads SYSCLK, see FIG. 3A-3J. During the first period of the SYSCLK signal, the UP/DOWN control signal stabilizes at logic zero indicating a phase lead for the CDTCLK signal. That is, the CDTCLK transition is too early and should be delayed longer to match up with the SYSCLK signal.

PDCLK is activated during the second period of SYSCLK for clocking up/down counter 130 and incrementing the counter value thereof to "110001" in response to the UP/DOWN control signal. The X-coordinate remains at "111" and the Y-coordinate changes to "001" at the inputs of 3-to-8 decode circuits 226 and 228, respectively.

The logic zero of PDCLK appears asynchronously at the D-input of flipflop 238 of delay circuit 20. The next rising edge of the CLKOUT signal at node 164 synchronizes the PDCLK signal to the CLKOUT signal. Thus, although the tap point change request from PDCLK may be asynchronous, the application of the tap point change occurs synchronized to the CLKOUT signal. Flipflop 240 delays PDCLK for one more period of CLKOUT to help prevent metastable conditions should the PDCLK signal and the CLKOUT signal from node 164 transition simultaneously. The delay also allows counter 18 and 3-to-8 decode circuits 226 and 228 to settle before changing the tap point of delay circuit 20. A logic one appears at the Q-output of flipflop 240 causing the output of NAND gate 236 to fall thereby opening 8-bit latches 230 and 234 and allowing the decoded values "00000000" and "00100000" of the X-coordinate and Y-coordinate control signals to pass to the tri-state buffers. One more CLKOUT period latches the logic zero of PDCLK at the Q-output of flipflop 242 and brings the output of NAND gate 236 back to logic one closing latches 230-234. The encoded X-coordinate and Y-coordinate control signals enable the conduction path through inverter 144, buffers 190-194 and tri-state buffers 214 and 220 for delaying the REFCLK signal one inverter delay (144) longer than the previous phase comparison cycle. Hence, the CDTCLK signal moves closer to the SYSCLK signal as shown in FIG. 3A-3B just before time t4. Moreover, it should be appreciated that the predetermined delay between times t3 and t4 of FIG. 3A-3J is made at least as long as the maximum delay through delay lines 142-224 so that the most recent update of CDTCLK is available for phase detector 16 for the next phase comparison cycle.

Now consider the second case as shown in FIG. 4A-4J from the same initial count value of "110000" and X-coordinate of "111" and Y-coordinate of "001". The REFCLK clock signal is delayed through buffer 150-154 and tri-state buffers 174 and 180 and then further delayed through clock distribution tree 22 thereby becoming the CDTCLK signal applied at the second input of phase detector 16. During the first period of the SYSCLK signal, the UP/DOWN control signal stabilizes at logic one indicating a phase lead for the SYSCLK signal. That is, the transition of CDTCLK occurs too late and should be delayed less to match up with the SYSCLK signal. PDCLK is activated during the second period of SYSCLK for clocking up/down counter 130 and decrementing the counter value thereof to "001111" in response to the UP/DOWN control signal. The X-coordinate remains at "111" and the Y-coordinate changes to "000" at the inputs of 3-to-8 decode circuits 226 and 228, respectively.

The logic zero of PDCLK appears asynchronously at the Dinput of flipflop 238 of delay circuit 20. The next rising edge of the CLKOUT signal at node 164 synchronizes the PDCLK signal to the CLKOUT signal while flipflop 240 delays PDCLK for one more period of CLKOUT. A logic one appears at the Q-output of flipflop 240 causing the output of NAND gate 236 to fall thereby opening 8-bit latches 230 and 234 and passing the decoded values "00000000" and "00010000" of the X-coordinate and Y-coordinate control signals to the tri-state buffers. One more CLKOUT period latches the logic zero of PDCLK at the Q-output of flipflop 242 and brings the output of NAND gate 236 back to logic one, latching the X-coordinate and Y-coordinate. The encoded X-coordinate and Y-coordinate control signals enable the conduction path through inverter 144, seven buffers including 190-192 and tri-state buffers 200 and 204 for delaying the REFCLK signal one inverter delay (144) less than the previous phase comparison cycle. Hence, the CDTCLK signal moves closer to the SYSCLK signal as shown in FIG. 4A-4B.

For the aforedescribed third case of operation wherein the SYSCLK and CDTCLK signals are within the deadzone window, the PDCLK signal remains logic one and therefore does not clock up/down counter 130. The X-coordinate and Y-coordinate remain unchanged as does the delay through delay circuit 20. Thus, no phase corrections are made between the SYSCLK and CDTCLK signals.

Figure 8:
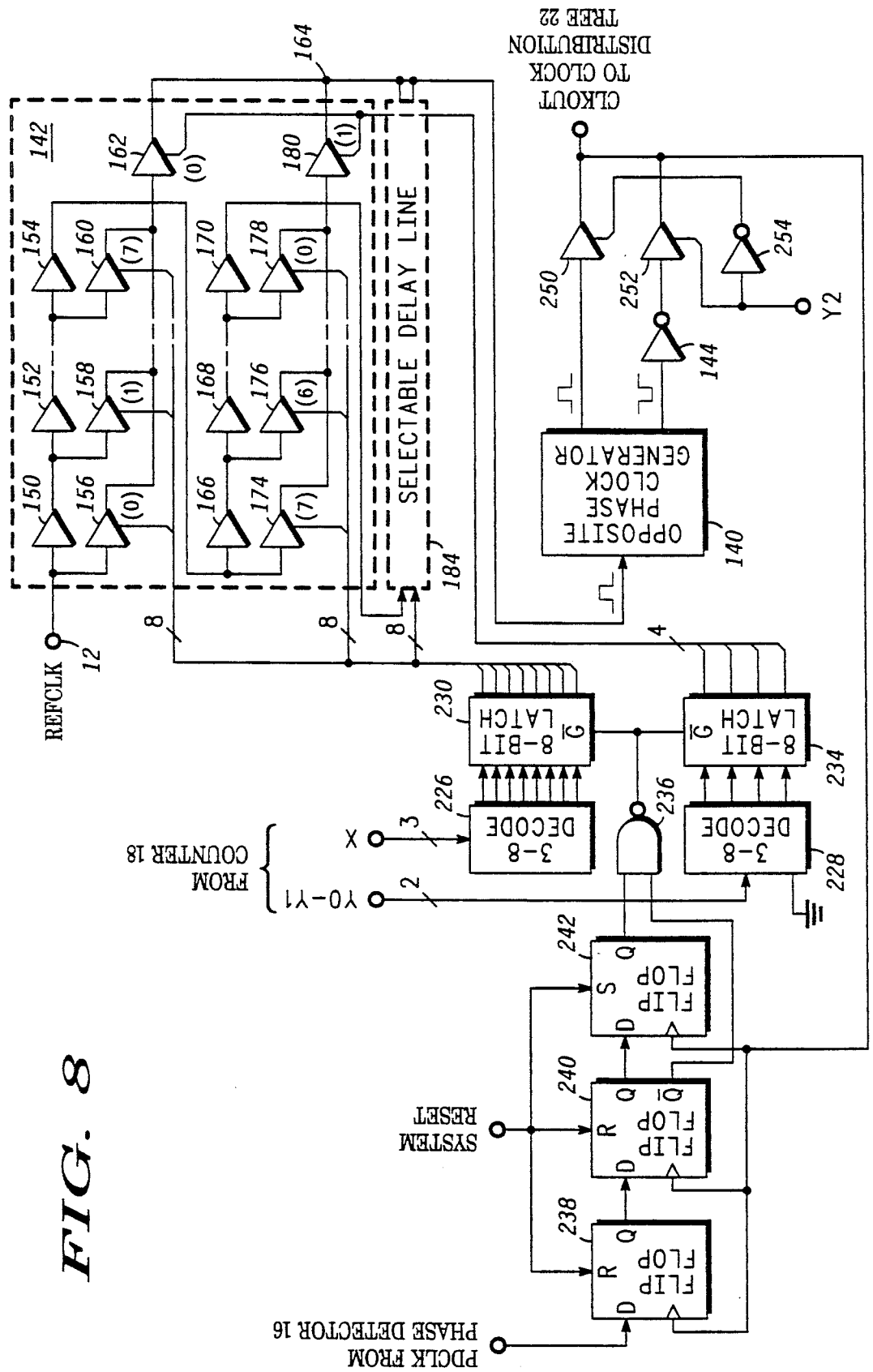
FIG. 8 is a schematic diagram illustrating an alternate embodiment of the selectable delay circuit.

An alteznate embodiment of delay circuit 20 is shown in FIG. 8 also including opposite phase clock generator 140 and delay lines 142 and 184 although delay lines 142 and 184 now precede opposite phase clock generator 140 in the signal path. This configuration eliminates the duplicate selectable delay lines 146 and 224. Components having a similar function are assigned the same reference numbers used in FIG. 7. Briefly, the REFCLK reference clock from input 12 is applied directly to selectable delay line 142 while node 164 is coupled to the input of opposite phase clock generator circuit 140. The first output of opposite phase clock generator 140 is coupled through tri-state buffer 250 to the CLKOUT output of delay circuit 20, while the second output having the opposite phase clock is complemented through inverter 144 and applied through tri-state buffer 252 also to the CLKOUT output of delay circuit 20.

The control for tri-state buffers 250 and 252 is the $Y_2$ control bit and its complement through inverter 254. The remaining bits $Y_0$ and $Y_1$ are applied at 3-to-8 decode circuit 228 which is wired for 2-to-4 decoding as is understood. The four least significant bits of 8-bit latch 234 control tri-state buffers 162 and 180 and the like in selectable delay line 184 as previously described.

Returning to the example with a value of "000000" in up/down counter 130, the encoded X-coordinate "000" and the Y-coordinate "00" produced a "00000001" at the output of 3-to-8 decode circuit 226 and a "0001" at the output of 3-to-8 decode circuit 228 where each is stored in 8-bit latches 230 and 234, respectively, thereby enabling tri-state buffers 156, 162 and 178. A propagation path from node 12 is established through tri-state buffers 156 and 162 to node 164 for providing the input signal to opposite phase clock generator circuit 140. The logic one of the complemented $Y_2$ signal enables tri-state buffer 250 passing the in-phase output signal of opposite phase clock generator circuit 140 to the CLKOUT output of delay circuit 20. After the next phase comparison cycle the count value is incremented to "000001". From Table 1, the encoded X-coordinate "000" latches a "00000001" into 8-bit latch 230 and the Y-coordinate "00" latches a "0001" into 8-bit latch 234. The $Y_2$ bit enables tri-state buffer 252 completing the propagation path from the second (out-of-phase) output of opposite phase clock generator circuit 140 to the CLKOUT output of delay circuit 20. Thus by changing the value of up/down counter 130 from "000000" to "000001", the delay through delay circuit 20 increases from a fixed minimum delay (two tri-state buffers like 156 and 162 plus opposite phase clock generator 140) to the same fixed minimum delay plus one inverter delay (144). Incrementing up/down counter 130 to the next value of "000010" enables tri-state buffers 158, 162 and 250 for providing two inverter delays through buffer 150 plus the fixed minimum delay, and yet another value of "000011" enables tri-state buffers 158, 162 and 252 for providing three inverter delays through buffer 150 and inverter 144 plus the fixed minimum delay. By now it should be clear that the delay through delay circuit 20 increases one inverter delay with each increment of up/down counter 130.

Counter 18 and delay circuit 20 may each comprise a macro of phase lock loop 10 in gate array technology. The pipeline approach of generating an up/down counter control signal during one period of the SYSCLK signal and the PDCLK during another period allows the counter macro and delay circuit macro to be conveniently disposed on the gate array without concern for timing problems and race conditions. Moreover, counter 18 and delay circuit 20 may use fixed geometry transistors as available in standard gate array cells.

There is a special concern for implementing delay circuit 20 with fixed geometry transistors, more specifically, opposite phase clock generator circuit 140 must provide an in-phase conduction path and an out-of-phase conduction path for the REFCLK signal applied thereto. The prior art typically uses an even number of inverters for the in-phase conduction path and an odd number of inverter for the out-of-phase conduction path and compensates for propagation difference by tuning the drive levels of the associated transistors. Such an option is not available with fixed geometry transistors in a gate array application.

Figure 9:
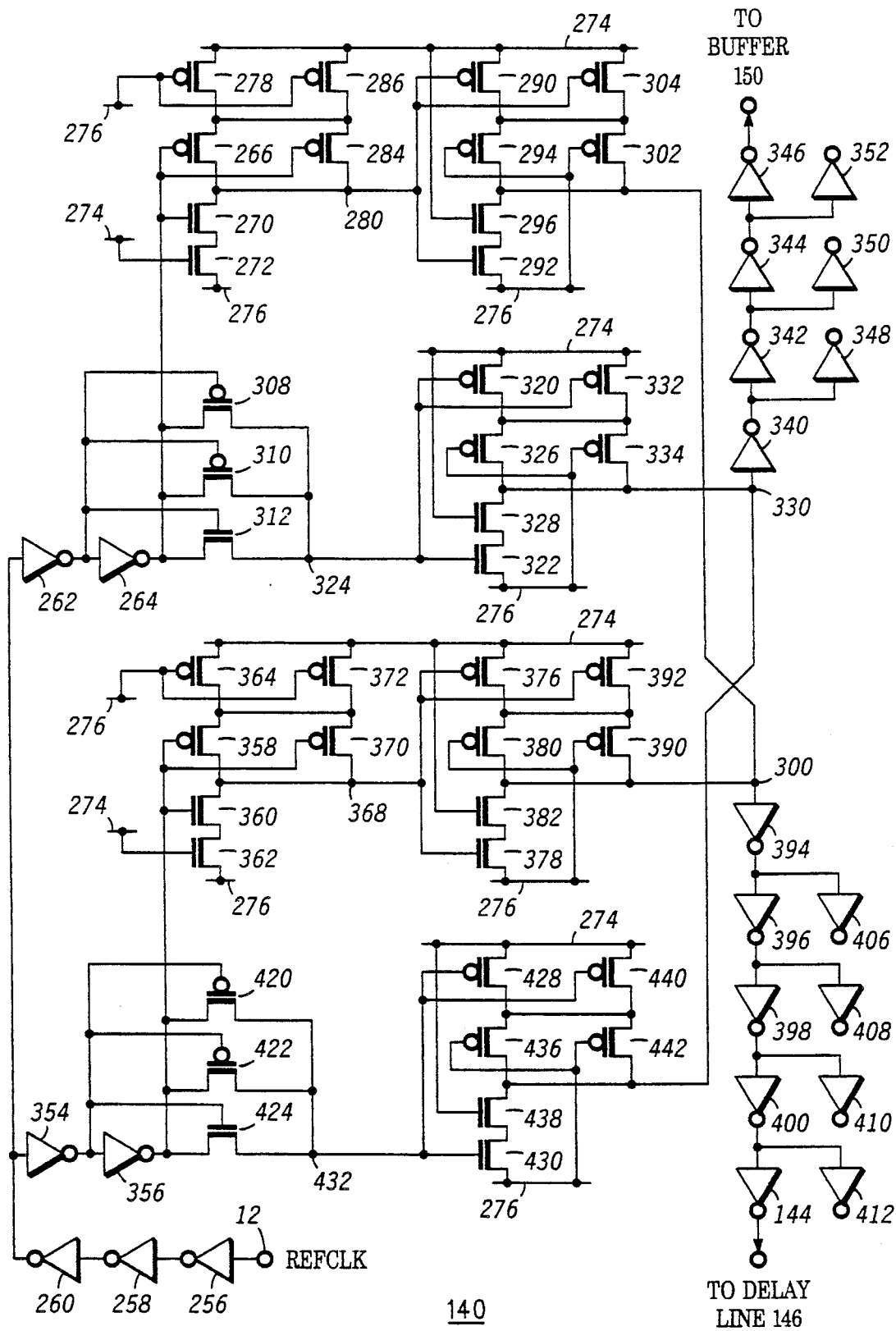
FIG. 9 is a schematic diagram illustrating the preferred embodiment of the opposite phase clock generator circuit.

Turning to FIG. 9, there is shown further detail of opposite phase clock generator circuit 140 implemented with fixed geometry transistors wherein the REFCLK clock signal applied at input 12 is complemented by inverters 256, 258 and 260 for providing a known edge transition rate and applied through inverters 262 and 264 to the gates of transistors 266 and 270. Transistor 272 includes a drain coupled to the source of transistor 270, a gate coupled to power supply conductor 274 typically operating at a positive potential such as $V_{DD}$, and a source coupled to power supply conductor 276 operating a ground potential. On the positive side, transistor 278 includes a source coupled to power supply conductor 274, a gate coupled to power supply conductor 276, and a drain coupled to the source of transistor 266.

Transistors 266-278 form an inverter having an output at node 280 that is the common drains of transistors 266 and 270. For extra driving and loading, the drain of transistor 284 is coupled to node 280 while its gate is coupled to the output of inverter 264, and transistor 286 includes a source coupled to power supply conductor 274, a gate coupled to power supply conductor 276 and a drain coupled to the drain of transistor 278 and to the source of transistor 284. Node 280 is also coupled to another inverter circuit at the gates of transistors 290 and 292. The sources of transistors 290 and 292 are coupled to power supply conductors 274 and 276, respectively. Transistor 294 includes a source coupled to the drain of transistor 290 and a gate coupled to power supply conductor 276, while transistor 296 includes a source coupled to the drain of transistor 292, a gate coupled to power supply conductor 274 and a drain coupled to the drain of transistor 294 at node 300. Again for extra driving and loading, the drain of transistor 302 is coupled to node 300 while its gate is coupled to power supply conductor 276, and transistor 304 includes a source is coupled to power supply conductor 274, a gate coupled to node 280 and a drain coupled to the drain of transistor 290 and to the source of transistor 302.

The output of inverter 262 is also coupled to the gates of transistors 308, 310 and 312, and the output of inverter 264 is coupled to the sources of transistors 308 and 310 and to the drain of transistor 312. The drains of transistors 308 and 310 are coupled together with the source of transistor 312 to the gates of transistors 320 and 322 at node 324. Transistors 308-312 form a transmission gate for the output signal of inverter 264 in response to the output signal of inverter 262. The sources of transistors 320 and 322 are coupled to power supply conductors 274 and 276, respectively. Transistor 326 includes a source coupled to the drain of transistor 320 and a gate coupled to power supply conductor 276, while transistor 328 includes a source coupled to the drain of transistor 322, a gate coupled to power supply conductor 274 and a drain coupled to the drain of transistor 326 at node 330. The gate of transistor 332 is coupled to node 324 and its source is coupled to power supply conductor 274. Transistor 334 includes a drain coupled to node 330, a gate coupled to power supply conductor 276 and a source coupled to the drain of transistor 320 and to the drain of transistor 332. The signal developed at node 330 is buffered through inverters 340, 342, 344 and 346 for providing a known edge transition rate and applied at the input of buffer 150 of FIG. 7. Inverters 348, 350 and 352 are coupled to the outputs of inverters 340, 342 and 344, respectively, for providing loading thereto.

Continuing with FIG. 9, the output of inverter 260 is also coupled through inverters 354 and 356 to the gates of transistors 358 and 360. Transistor 362 includes a drain coupled to the source of transistor 360, a gate coupled to power supply conductor 274 and a source coupled to power supply conductor 276. On the positive side, transistor 364 includes a source coupled to power supply conductor 274, a gate coupled to power supply conductor 276 and a drain coupled to the source of transistor 358. Transistors 358-364 form an inverter having an output at node 368 that is the common drains of transistors 358 and 360. For extra driving and loading, the drain of transistor 370 is coupled to node 368 while its gate is coupled to the output of inverter 356, and transistor 372 includes a source coupled to power supply conductor 274, a gate coupled to power supply conductor 276 and a drain coupled to the drain of transistor 364 and to the source of transistor 370. Node 368 is also coupled to another inverter circuit at the gates of transistors 376 and 378. The sources of transistors 376 and 378 are coupled to power supply conductors 274 and 276, respectively. Transistor 380 includes a source coupled to the drain of transistor 376 and a gate coupled to power supply conductor 276, while transistor 382 includes a source coupled to the drain of transistor 378, a gate coupled to power supply conductor 274 and a drain coupled to the drain of transistor 380 at node 300. Again for extra driving and loading, the drain of transistor 390 is coupled to node 300 and its gate is coupled to power supply conductor 276. Transistor 392 includes a gate coupled to node 368, a source coupled to power supply conductor 274 and a drain coupled to the drain of transistor 376 and to the source of transistor 390. The signal developed at node 300 is buffered through inverters 394, 396, 398 and 400 for providing a known edge transition rate and applied at the input of inverter 144, see FIG. 7. Inverters 406, 408, 410 and 412 are coupled to the outputs of inverters 394, 396, 398 and 400, respectively, for providing loading thereto.

The output of inverter 354 is also coupled to the gates of transistors 420, 422 and 424, while the output of inverter 356 is coupled to the sources of transistors 420 and 422 and to the drain of transistor 424. The drains of transistors 420 and 422 are coupled together with the source of transistor 424 to the gates of transistors 428 and 430 at node 432. Transistors 420-424 form a transmission gate for the output signal of inverter 356 in response to the output signal of inverter 354. The sources of transistors 428 and 430 are coupled to power supply conductors 274 and 276, respectively. Transistor 436 includes a source coupled to the drain of transistor 428 and a gate coupled to power supply conductor 276, while transistor 438 includes a source coupled to the drain of transistor 430, a gate coupled to power supply conductor 274 and a drain coupled to the drain of transistor 436 at node 330. The gate of transistor 440 is coupled to node 432 and its source is coupled to power supply conductor 274. Transistor 442 includes a drain coupled to node 330, a gate coupled to power supply conductor 276 and a source coupled to the drain of transistor 428 and to the drain of transistor 440.

The purpose of opposite phase clock generator circuit 140 is to achieve complementary phase (180 degrees) output signals having equal edge transition rates with fixed geometry transistors. Transistors 266-286 form one inverter while transistors 290-304 form another inverter. The signal path through inverters 256, 258, 260, 262, 264 and inverter combinations 266-286 and 290-304 (seven inverters total) provide an output signal at node 300 operating substantially 180 degrees out-of-phase with respect to the REFCLK signal from node 12. Transistors 308-312 behave as an in-phase transmission gate while transistors 320-334 form an inverter. Therefore, the signal path through inverters 256, 258, 260, 262, 264, transmission gate 308-312 and inverter combination 320-334 (six inverters total) provides an output signal at node 330 operating in-phase with respect to the REFCLK signal from node 12.

Consider first the signal path through inverter 266-286 and inverter 290-304. When the REFCLK signal applied at input 12 is rising, a high signal is developed at the output of inverter 262 driving the gates of transistors 308, 310 and 312 while a low signal forms at the gates of transistors 266 and 270. The combination of inverters 256-262 operate as a buffer providing clean edges while inverter 264 ensures that the gates of transistors 308-312 are activated one inverter delay before the REFCLK signal arrives at transmission gate transistors 308-312. The high signal at the gates of transistors 308-312 turns on transistor 312 passing the low signal from the output of inverter 264 to node 324. Transistors 308 and 310 are off. Thus, node 324 is driven by N-channel transistor 312 in series with a similar N-channel transistor in inverter 264 (not shown). Furthermore, node 324 is loaded with the parasitic drain capacitances of transistors 308, 310 and 312 and the parasitic gate capacitances of transistors 320, 322 and 332. The low signal at the gate of transistors 266 and 284 pulls node 280 high toward power supply conductor 274 through parallel conduction paths of transistors 266 and 278 and transistors 284 and 286. Transistor 270 is off. Node 280 is thus driven by P-channel transistors 266, 278, 284 and 286 and loaded with the parasitic drain capacitance of transistors 266, 270 and 284 and the parasitic gate capacitances of transistors 290, 292 and 304. With equal geometries, the drive of a P-channel transistor is typically one-half that of an N-channel transistor. Thus, the drive level at node 280 (two paths of serially coupled P-channel transistors) is equal to that at node 324 (one path of serially coupled N-channel transistors). Moreover, nodes 280 and 324 have equal parasitic capacitive loading. Therefore, the propagation delay from input 12 to node 280 is substantially the same as from input 12 to node 324.

The low signal at node 324 turns on transistors 320 and 332 and pulls node 330 high toward power supply conductor 274 through the parallel conduction paths of transistors 320 and 326 and transistors 332 and 334 for providing the in-phase output signal of opposite phase clock generator circuit 140. Transistor 322 is off. Node 330 is thus driven by P-channel transistors 320, 326, 332 and 334 and loaded by the drain capacitance of transistors 326, 328 and 334 and the gate capacitance associated with inverter 340. The high signal at node 280 activates transistor 292 pulling node 300 low toward power supply conductor 276 through transistors 292 and 296 for providing the out-of-phase output signal of opposite phase clock generator circuit 140. Node 300 is driven by N-channel transistors 292 and 296 which is substantially equal to the drive level at node 330. Node 300 is loaded by the drain capacitance of transistors 294, 296 and 302 and the gate capacitance associated with inverter 394. Hence, the propagation delay from node 280 to node 300 is substantially the same as from node 324 to node 330. Notice that the continuously active transistors 272, 278 and 286 are positioned on the outside of the inverter while transistors 296, 294 and 302 are positioned on the inside of the inverter. The propagation delay is slightly longer with the continuously active transistors on the inside of the inverter; however, by using one of each, the drive levels tend to average out any mismatches in the fixed transistor geometries.

When the REFCLK signal applied at input 12 is falling, the low signal developed at the output of inverter 262 drives the gates of transistors 308, 310 and 312 while a high signal forms at the gates of transistors 266 and 270. The low signal at the gates of transistors 308-312 turns on transistors 308 and 310 passing the high signal from the output of inverter 264 to node 324. Transistor 312 is off. Thus, node 324 is driven by P-channel transistors 308 and 310 in series with a similar P-channel transistor combination in inverter 264 (not shown). Furthermore, node 324 is loaded with the parasitic drain capacitances of transistors 308, 310 and 312 and the parasitic gate capacitances of transistors 320, 322 and 332. The high signal at the gate of transistor 266 pulls node 280 low toward power supply conductor 276 through transistors 270 and 272. Transistors 266 and 284 are off. Node 280 is thus driven by N-channel transistors 270 and 272 and loaded with the parasitic drain capacitance of transistors 266, 270 and 284 and the parasitic gate capacitances of transistors 290, 292 and 304. The drive level at node 280 (one path of serially coupled N-channel transistors) is equal to that at node 324 (two paths of serially coupled P-channel transistors). Moreover, nodes 280 and 324 have equal parasitic capacitive loading. Therefore, the propagation delay from input 12 to node 280 is substantially the same as from input 12 to node 324.

The high signal at node 324 turns on transistor 322 and pulls node 330 low toward power supply conductor 276 through transistors 322 and 328 for providing the in-phase output signal of opposite phase clock generator circuit 140. Transistors 320 and 332 are off. Node 330 is thus driven by N-channel transistors 322 and 328 and loaded by the drain capacitance of transistors 326, 328 and 334 and the gate capacitance associated with inverter 340. The low signal at node 280 activates transistors 290 and 304 pulling node 300 high toward power supply conductor 274 through parallel conduction paths of transistors 290, 294, 302 and 304 for providing the out-of-phase output signal of opposite phase clock generator circuit 140. Node 300 is thus driven by P-channel transistors 290, 294, 302 and 304 which is substantially equal to the drive level at node 330. Hence, the propagation delay from node 280 to node 300 is substantially the same as from node 324 to node 330. The in-phase and out-of-phase conduction paths are duplicated in transistors 358-442 and operate as described above for providing addition drive to nodes 300 and 330 and further averaging out the effects of transistor mismatching. Briefly, transistors 358-372 and transistors 376-392 each operate as an inverter with known drive levels and loading. Transistors 420-424 operate as a transmission gate while transistors 428-442 form an inverter such that the delay through inverters 358-372 and 376-392 is substantially equal to the delay through transmission gate 420-424 and inverter 428-442 for providing first and second output signals at nodes 330 and 300, respectively, operating in-phase and 180 degrees out-of-phase with the REFCLK signal. Thus, opposite phase clock generator circuit 140 may be constructed with transistors having standard geometries such as available in a gate array application.

Clock distribution tree 22 is shown in FIG. 10 having an input coupled for receiving the CLKOUT clock signal from delay circuit 20 which is buffered through inverters 450 and 452 for providing a clean edge. The output signal of inverter 452 is further buffered through several clock distribution paths, one of which includes inverters 454 and 456 for providing the output clock signal which is applied at the clock input of flipflop 24 and the second input of phase detector 16. The other distribution paths include one or more buffers like inverters 460 and 462, inverters 464 and 466, and inverters 468 and 470 for providing clock signal to flipflops like 24 of the gate array.

Hence, what has been provided is a novel phase detector responsive to first and second inputs signals for providing first and second output pulses at first and second outputs, wherein the first output pulse has at least a minimum duration when the first input signal leads the second input signal by a predetermined phase difference or when the first input signal and the second input signal are within the predetermined phase difference, while the first output pulse has less than the minimum duration when the first input signal lags the second input signal by the predetermined phase difference. The first and second input signals are also compared for detecting the predetermined phase difference between the second input signal and the first input signal and providing the second output pulse having at least the minimum duration when the second input signal leads the first input signal by the predetermined phase difference or when the second input signal and the first input signal are within the predetermined phase difference. The second output pulse has less than the minimum duration when the second input signal lags the first input signal by the predetermined phase difference. An output clock signal is enabled when the first or second output pulse has at least the minimum duration and disabled when the clock signal when both have at least the minimum duration thereby avoiding unnecessary corrections when the input phase differential is less than the resolution of the phase detector.

We claim:

1. A phase detector circuit having first and second inputs respectively coupled for receiving first and second input signals and having first and second outputs for providing first and second output pulses, comprising:

first means having a first input coupled for receiving the first input signal and a second input coupled for receiving the second input signal which is delayed through a predetermined propagation delay for detecting a predetermined phase difference between the first input signal and the second input signal and providing the first output pulse of the phase detector at an output having at least a minimum duration when the first input signal leads the second input signal by said predetermined phase difference, the first output pulse also having at least said minimum duration when the first input signal and the second input signal are within said predetermined phase difference, the first output pulse having less than said minimum duration when the first input signal lags the second input signal by said predetermined phase difference; and second means having a first input coupled for receiving the second input signal and a second input coupled for receiving the first input signal which is delayed through said predetermined propagation delay for detecting said predetermined phase difference between the second input signal and the first input signal and providing the second output pulse of the phase detector at an output having at least said minimum duration when the second input signal leads the first input signal by said predetermined phase difference, the second output pulse also having at least said minimum duration when the second input signal and the first input signal are within said predetermined phase difference, the second output pulse having less than said minimum duration when the second input signal lags the first input signal by said predetermined phase difference.

2. The phase detector circuit of claim 1 wherein said first means includes:

a first inverter having an input coupled for receiving the second input signal and having an output;

a first NAND gate having first and second inputs and an output, said first input being coupled to said output of said first inverter, said second input being coupled to a first source of operating potential;

a second NAND gate having first and second inputs and an output, said first input being coupled to said output of said first NAND gate, said second input being coupled to said first source of operating potential; and a third NAND gate having first and second inputs and an output, said first input being coupled to said output of said second NAND gate, said second input being coupled for receiving the first input signal, said output providing the first output pulse of the phase detector.

3. The phase detector circuit of claim 2 wherein said second means includes:
   a second inverter having an input coupled for receiving the first input signal and having an output;
   a fourth NAND gate having first and second inputs and an output, said first input being coupled to said output of said second inverter, said second input being coupled to said first source of operating potential;
   a fifth NAND gate having first and second inputs and an output, said first input being coupled to said output of said fourth NAND gate, said second input being coupled to said first source of operating potential; and
   a sixth NAND gate having first and second inputs and an output, said first input being coupled to said output of said fifth NAND gate, said second input being coupled for receiving the second input signal, said output providing the second output pulse of the phase detector.

4. The phase detector circuit of claim 3 further comprising:
   third means coupled to said output of said first means for latching the first output pulse having at least said minimum duration at an output;
   fourth means coupled to said output of said second means for latching the second output pulse having at least said minimum duration at an output; and
   fifth means coupled to said outputs of said third means and fourth means and responsive to the latched first and second output pulses for providing a control signal and a clock signal.

5. The phase detector circuit of claim 4 wherein said control signal has a first state when the first input signal leads the second input signal by a predetermined phase difference and a second state when the second input signal leads the first input signal by the predetermined phase difference, said clock signal being disabled when both the first and second output pulses have at least said minimum duration.

6. The phase detector circuit of claim 5 wherein said predetermined phase difference is substantially equal to the delay through said first inverter.

7. The phase detector circuit of claim 6 wherein said first means further includes:
   a first flipflop having a data input, a clock input, a reset input and an output, said data input being coupled to said first source of operating potential, said clock input being coupled for receiving the second input signal;
   a second flipflop having a data input, a clock input, a reset input and an output, said data input being coupled to said output of said first flipflop, said clock input being coupled for receiving the second input signal;
   a third flipflop having a data input, a clock input, a reset input and an output, said data input being coupled to said output of said second flipflop, said clock input being coupled for receiving the second input signal;
   a fourth flipflop having a data input, a clock input, a reset input and an output, said data input being coupled to said output of said third flipflop, said clock input being coupled for receiving the second input signal;
   a third inverter having an input coupled to said output of said first flipflop and having an output; and
   a fourth inverter having an input coupled to said output of said third inverter and having an output coupled to said input of said first inverter.

8. The phase detector circuit of claim 7 wherein said second means further includes:
   a fifth flipflop having a data input, a clock input, a reset input and an output, said data input being coupled to said first source of operating potential, said clock input being coupled for receiving the first input signal;
   a sixth flipflop having a data input, a clock input, a reset input and an output, said data input being coupled to said output of said fifth flipflop, said clock input being coupled for receiving the first input signal;
   a seventh flipflop having a data input, a clock input, a reset input and an output, said data input being coupled to said output of said sixth flipflop, said clock input being coupled for receiving the first input signal;
   an eighth flipflop having a data input, a clock input, a reset input and an output, said data input being coupled to said output of said seventh flipflop, said clock input being coupled for receiving the first input signal;
   a fifth inverter having an input coupled to said output of said fifth flipflop and having an output; and
   a sixth inverter having an input coupled to said output of said fifth inverter and having an output coupled to said input of said second inverter.

9. The phase detector circuit of claim 8 further including a seventh NAND gate having first and second inputs and an output, said first input being coupled to said output of said fourth flipflop, said second input being coupled to said output of said eighth flipflop, said output being coupled to said reset inputs of said first, second, third, fourth, fifth, sixth, seventh and eighth flipflops for providing a reset signal thereto.

10. The phase detector circuit of claim 9 wherein said third means includes:
   an eighth NAND gate having first and second inputs and an output, said first input being coupled to said output of said third NAND gate; and
   a ninth NAND gate having first and second inputs and an output, said first input being coupled to said output of said eighth NAND gate, said second input being coupled to said output of said seventh NAND gate, said output being coupled to said second input of said eighth NAND gate for providing a latching operation.

11. The phase detector circuit of claim 10 wherein said fourth means includes:
   a tenth NAND gate having first and second inputs and an output, said first input being coupled to said output of said sixth NAND gate; and
   an eleventh NAND gate having first and second inputs and an output, said first input being coupled to said output of said tenth NAND gate, said second input being coupled to said output of said seventh NAND gate, said output being coupled to said second input of said tenth NAND gate for providing a latching operation.

12. The phase detector circuit of claim 11 wherein said fifth means includes:

a twelfth NAND gate having first, second and third inputs and an output, said first input being coupled to said output of said eleventh NAND gate, said second input being coupled to said output of said seventh NAND gate;

a thirteenth NAND gate having first, second and third inputs and an output, said first input being coupled to said output of said twelfth NAND gate, said second input being coupled to said first source of operating potential, said third input being coupled to said output of said ninth NAND gate, said output being coupled to said third input of said twelfth NAND gate for providing said control signal;

a fourteenth NAND gate having first and second inputs and an output, said first input being coupled to said output of said twelfth NAND gate, said second input being coupled to said output of said thirteenth NAND gate; and a fifteenth NAND gate having first, second and third inputs and an output, said first input being coupled to said output of said second flipflop, said second input being coupled to said output of said fourteenth NAND gate, said third input being coupled to said output of said sixth flipflop, said output providing said clock signal.

13. In a phase lock loop of a gate array a phase detector circuit having first and second inputs respectively coupled for receiving first and second inputs signals and having a first output for providing a control signal and a second output for providing a clock signal, the phase detector comprising:

first means having a first input coupled for receiving the first input signal and a second input coupled for receiving the second input signal which is delayed through a predetermined propagation delay for detecting a predetermined phase difference between the first input signal and the second input signal and providing a first output pulse at an output having at least a minimum duration when the first input signal leads the second input signal by said predetermined phase difference, said first output pulse also having at least said minimum duration when the first input signal and the second input signal are within said predetermined phase difference, said first output pulse having less than said minimum duration when the first input signal lags the second input signal by said predetermined phase difference;

second means having a first input coupled for receiving the second input signal and a second input coupled for receiving the first input signal which is delayed through a predetermined propagation delay for detecting a predetermined phase difference between the second input signal and the first input signal and providing a second output pulse at an output having at least said minimum duration when the second input signal leads the first input signal by said predetermined phase difference, said second output pulse also having at least said minimum duration when the first input signal and the second input signal are within said predetermined phase difference, said second output pulse having less than said minimum duration when the second input signal lags the first input signal by said predetermined phase difference;

third means coupled to said output of said first means for latching said first output pulse having at least said minimum duration at an output;

fourth means coupled to said output of said second means for latching said second output pulse having at least said minimum duration at an output; and fifth means coupled to said outputs of said third means and fourth means and responsive to the latched first and second output pulses for providing the control signal and the clock signal at the first and second outputs of the phase detector circuit.

14. The phase detector circuit of claim 13 wherein the control signal has a first state when the first input signal leads the second input signal by said predetermined phase difference and a second state when the second input signal leads the first input signal by said predetermined phase difference, the clock signal being disabled when both the first and second output pulses have at least said minimum duration.

15. The phase detector circuit of claim 14 wherein said first means includes:

a first inverter having an input coupled for receiving the second input signal and having an output;

a first NAND gate having first and second inputs and an output, said first input being coupled to said output of said first inverter, said second input being coupled to a first source of operating potential;

a second NAND gate having first and second inputs and an output, said first input being coupled to said output of said first NAND gate, said second input being coupled to said first source of operating potential; and a third NAND gate having first and second inputs and an output, said first input being coupled to said output of said second NAND gate, said second input being coupled for receiving the first input signal, said output providing said first output pulse of said first means.

16. The phase detector circuit of claim 15 wherein said second means includes:

a second inverter having an input coupled for receiving the first input signal and having an output;

a fourth NAND gate having first and second inputs and an output, said first input being coupled to said output of said second inverter, said second input being coupled to said first source of operating potential;

a fifth NAND gate having first and second inputs and an output, said first input being coupled to said output of said fourth NAND gate, said second input being coupled to said first source of operating potential; and a sixth NAND gate having first and second inputs and an output, said first input being coupled to said output of said fifth NAND gate, said second input being coupled for receiving the second input signal, said output providing said second output pulse of said second means.

17. The phase detector circuit of claim 16 wherein said predetermined phase difference is substantially equal to the delay through said first inverter.

18. The phase detector circuit of claim 17 wherein said first means further includes:

a first flipflop having a data input, a clock input, a reset input and an output, said data input being coupled to said first source of operating potential, said clock input being coupled for receiving the second input signal;

a second flipflop having a data input, a clock input, a reset input and an output, said data input being coupled to said output of said first flipflop, said clock input being coupled for receiving the second input signal;

a third flipflop having a data input, a clock input, a reset input and an output, said data input being coupled to said output of said second flipflop, said clock input being coupled for receiving the second input signal;

a fourth flipflop having a data input, a clock input, a reset input and an output, said data input being coupled to said output of said third flipflop, said clock input being coupled for receiving the second input signal;

a third inverter having an input coupled to said output of said first flipflop and having an output; and a fourth inverter having an input coupled to said output of said third inverter and having an output coupled to said input of said first inverter.

19. The phase detector circuit of claim 18 wherein said second means further includes:

a fifth flipflop having a data input, a clock input, a reset input and an output, said data input being coupled to said first source of operating potential, said clock input being coupled for receiving the first input signal;

a sixth flipflop having a data input, a clock input, a reset input and an output, said data input being coupled to said output of said fifth flipflop, said clock input being coupled for receiving the first input signal;

a seventh flipflop having a data input, a clock input, a reset input and an output, said data input being coupled to said output of said sixth flipflop, said clock input being coupled for receiving the first input signal;

an eighth flipflop having a data input, a clock input, a reset input and an output, said data input being coupled to said output of said seventh flipflop, said clock input being coupled for receiving the first input signal;

a fifth inverter having an input coupled to said output of said fifth flipflop and having an output; and a sixth inverter having an input coupled to said output of said fifth inverter and having an output coupled to said input of said second inverter.

20. The phase detector circuit of claim 19 further including a seventh NAND gate having first and second inputs and an output, said first input being coupled to said output of said fourth flipflop, said second input being coupled to said output of said eighth flipflop, said output being coupled to said reset inputs inputs of said first, second, third, fourth, fifth, sixth, seventh and eighth flipflops for providing a reset signal thereto.

21. The phase detector circuit of claim 20 wherein said third means includes:

an eighth NAND gate having first and second inputs and an output, said first input being coupled to said output of said third NAND gate; and a ninth NAND gate having first and second inputs and an output, said first input being coupled to said output of said eighth NAND gate, said second input being coupled to said output of said seventh NAND gate, said output being coupled to said second input of said eighth NAND gate for providing a latching operation.

22. The phase detector circuit of claim 21 wherein said fourth means includes:

a tenth NAND gate having first and second inputs and an output, said first input being coupled to said output of said sixth NAND gate; and an eleventh NAND gate having first and second inputs and an output, said first input being coupled to said output of said tenth NAND gate, said second input being coupled to said output of said seventh NAND gate, said output being coupled to said second input of said tenth NAND gate for providing a latching operation.

23. The phase detector circuit of claim 22 wherein said fifth means includes:

a twelfth NAND gate having first, second and third inputs and an output, said first input being coupled to said output of said eleventh NAND gate, said second input being coupled to said output of said seventh NAND gate;

a thirteenth NAND gate having first, second and third inputs and an output, said first input being coupled to said output of said twelfth NAND gate, said second input being coupled to said first source of operating potential, said third input being coupled to said output of said ninth NAND gate, said output being coupled to said third input of said twelfth NAND gate for providing the control signal of the phase detector circuit;

a fourteenth NAND gate having first and second inputs and an output, said first input being coupled to said output of said twelfth NAND gate, said second input being coupled to said output of said thirteenth NAND gate; and a fifteenth NAND gate having first, second and third inputs and an output, said first input being coupled to said output of said second flipflop, said second input being coupled to said output of said fourteenth NAND gate, said third input being coupled to said output of said sixth flipflop, said output providing the clock signal of the phase detector circuit.

24. A method of detecting a predetermined phase difference between first and second input signal and providing first and second output pulses in response thereto, comprising the steps of:

generating the first output pulse having at least a minimum duration when the first input signal leads the second input signal by the predetermined phase difference upon detecting the predetermined phase difference between the first input signal and the second input signal, the first output pulse having at least said minimum duration when the first input signal and the second input signal are within the predetermined phase difference, the first output pulse having less than said minimum duration when the first input signal lags the second input signal by the predetermined phase difference; and generating the second output pulse having at least said minimum duration when the second input signal leads the first input signal by the predetermined phase difference upon detecting the predetermined phase difference between the second input signal and the first input signal, the second output pulse having at least said minimum duration when the first input signal and the second input signal are within the predetermined phase difference, the second output pulse having less than said minimum duration when the second input signal lags the first input signal by the predetermined phase difference.

25. The method of claim 24 further including the steps of:

latching the first and second output pulses; and activating a control signal and a clock signal in response to the latched first and second output pulses, said control signal having a first state when the first input signal leads the second input signal by said predetermined phase difference and a second state when the second input signal leads the first input signal by said predetermined phase difference, said clock signal being disabled when both the first and second output pulses have at least said minimum duration.

26. A phase detector circuit having first and second inputs respectively coupled for receiving first and second inputs signals and having first and second outputs for providing first and second output pulses, comprising:

first means having a first input coupled for receiving the first input signal and a second input coupled for receiving the second input signal which is delayed through a predetermined propagation delay for detecting a predetermined phase difference between the first input signal and the second input signal and providing the first output pulse of the phase detector at an output having at least a minimum duration when the first input signal leads the second input signal by said predetermined phase difference, the first output pulse also having at least a minimum duration when the first input signal and the second input signal are within said predetermined phase difference, the first output pulse having less than said minimum duration when the first input signal lags the second input signal by said predetermined phase difference, said first means including, (a) a first inverter having an input coupled for receiving the second input signal and having an output, (b) a first NAND gate having first and second inputs and an output, said first input being coupled to said output of said first inverter, said second input being coupled to a first source of operating potential, (c) a second NAND gate having first and second inputs and an output, said first input being coupled to said output of said first NAND gate, said second input being coupled to said first source of operating potential, and (d) a third NAND gate having first and second inputs and an output, said first input being coupled to said output of said NAND gate, said second input being coupled for receiving the first input signal, said output providing the first output pulse of the phase detector; and second means having a first input coupled for receiving the second input signal and a second input coupled for receiving the first input signal which is delayed through said predetermined propagation delay for detecting said predetermined phase difference between the second input signal and the first input having at least said minimum duration when the second input signal leads the first input signal by said predetermined phase difference, the second output pulse also having at least said minimum duration when the second input signal and the first input signal are within said predetermined phase difference, the second output pulse having less than said minimum duration when the second input signals lags the first input signal by said predetermined phase difference.

\* \* \* \* \*

UNITED STATES PATENT AND TRADEMARK OFFICE
CERTIFICATE OF CORRECTION

PATENT NO. : 5,121,010

DATED : June 9, 1992

INVENTOR(S) : Gary Hoshizaki, Paul Fletcher and Laurin Ashby

It is certified that error appears in the above-identified patent and that said Letters Patent is hereby corrected as shown below:

claim 26, column 33, line 32, please delete the word "a" and insert the word --said--.

claim 26, column 34, line 26, please insert --signal and providing the second output pulse of the phase detector at an output-- in front of the word "having" and after the word "input".

Signed and Sealed this

Twelfth Day of October, 1993

Attest:

BRUCE LEHMAN

Attesting Officer

Commissioner of Patents and Trademarks